(12) United States Patent
Wilson

(10) Patent No.: US 8,319,570 B2
(45) Date of Patent: Nov. 27, 2012

(54) PULSE WIDTH MODULATION

(75) Inventor: Martin Paul Wilson, Cambridge (GB)

(73) Assignee: Nujira Limited (GB)

( * ) Notice: Subject to any disclaimer, the term of this patent is extended or adjusted under 35 U.S.C. 154(b) by 84 days.

(21) Appl. No.: 12/988,376

(22) PCT Filed: Apr. 20, 2009

(86) PCT No.: PCT/EP2009/054676
§ 371 (c)(1),
(2), (4) Date: Dec. 17, 2010

(87) PCT Pub. No.: WO2009/127739
PCT Pub. Date: Oct. 22, 2009

(65) Prior Publication Data
US 2011/0095837 A1    Apr. 28, 2011

(30) Foreign Application Priority Data
Apr. 18, 2008    (GB) .................................. 0807133.4

(51) Int. Cl.
*H03K 7/08* (2006.01)
(52) U.S. Cl. ........ 332/109; 332/111; 332/143; 327/172; 323/283
(58) Field of Classification Search .................. 332/109, 332/111, 119, 123, 143; 327/172; 323/283; 375/238; 318/599, 606, 811
See application file for complete search history.

(56) References Cited

U.S. PATENT DOCUMENTS

| 5,615,229 | A | * | 3/1997 | Sharma et al. ................. 375/259 |
| 6,348,781 | B1 | | 2/2002 | Midya et al. |
| 7,068,095 | B2 | | 6/2006 | Bernardon |
| 7,298,209 | B1 | | 11/2007 | Sutardja |
| 2007/0146069 | A1 | * | 6/2007 | Wu et al. ........................ 330/251 |
| 2008/0303502 | A1 | * | 12/2008 | Haiplik ......................... 323/283 |

FOREIGN PATENT DOCUMENTS

| EP | 1 530 286 A1 | 5/2005 |
| JP | 2005-109590 | 4/2005 |

OTHER PUBLICATIONS

K. Sylvan, "Britiash Search Report for International Application No. GB0807133.4", Jul. 9, 2008, Publisher: UK Intellectual Property Office, Published in: UK.

(Continued)

*Primary Examiner* — Joseph Chang
*Assistant Examiner* — Jeffrey Shin
(74) *Attorney, Agent, or Firm* — Kaplan Breyer Schwarz & Ottesen, LLP

(57) ABSTRACT

There is disclosed a method and apparatus for generating, in an envelope tracking modulator of a mobile radio transmission apparatus, a pulse width modulated, PWM, signal representing a time-varying signal, the method comprising, for each time cycle: a) generating a rising ramp from a first voltage level to a second voltage level; b) generating a falling ramp from the second voltage level to the first voltage level; c) detecting a rising slope of the time-varying signal crossing the falling ramp and responsive thereto if the PWM signal is at the first voltage level, transitioning the PWM signal to the second voltage signal; d) detecting a falling slope of the time-varying signal crossing the rising ramp, and responsive thereto if the PWM signal is at the second voltage level, transitioning the PWM signal to the first voltage signal.

29 Claims, 15 Drawing Sheets

OTHER PUBLICATIONS

Internet, "Pulse-width modulation", "Retrieved from internet", Oct. 15, 2007, Publisher: URL:htp//web.archive.org/web/20071015223359/http://en.wikipedia.org/wiki/Pulse-width-modulation>.

Nielsen K., "Parallel Phase Shifted Carrier Pulse Width Modulation (PSCPWM)—A novel approach to switching power amplifier design", "ISSN: 1549-4950", Mar. 22, 1997, pp. 1-26, Publisher: Journal of the audio engineering society, audio engineering society, Published in: New York, New York, US.

* cited by examiner

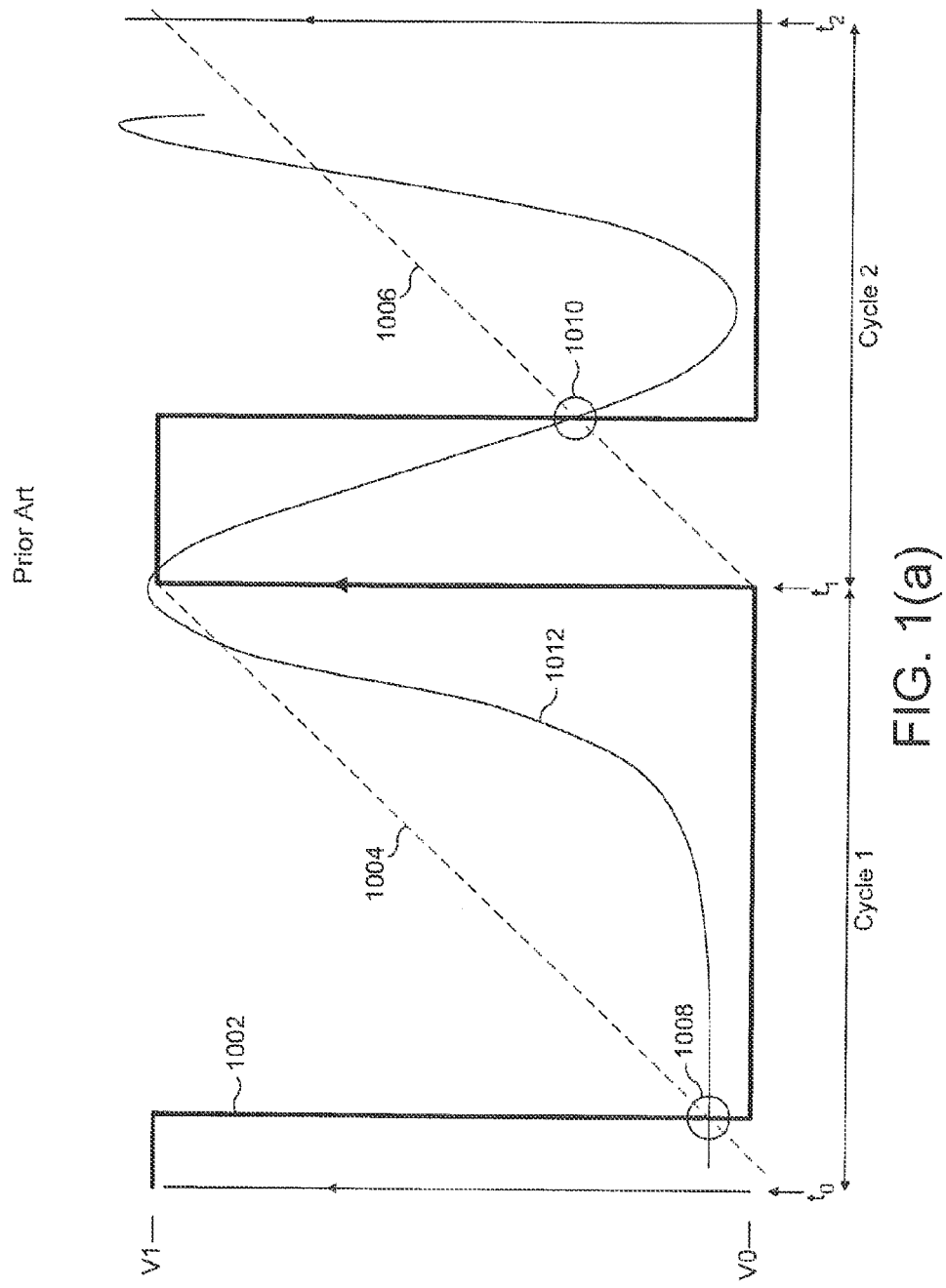

PULSE WIDTH MODULATION

BACKGROUND TO THE INVENTION

1. Field of the Invention

The present invention relates to an improved pulse width modulation technique. The invention is particularly advantageous when applied in a method or system for the efficient generation of a switched power supply. The invention finds particular advantageous application in mobile communication handsets, although the invention is not limited to such an application.

2. Description of the Related Art

It is known in the art that efficient power supply generation requires some form of switching means rather than a linear regulator providing a constant voltage. Switched mode power supplies are well-known in the art. Switched mode power supplies have, however, been typically used for static or slowly varying DC voltages. In such applications, the main consideration for the transient response is to respond to rapid changes in the load current rather than rapid changes in output voltage.

With recent advances in radio communications, and more particularly in mobile telecommunications, efficient operation of transmitters is required for applications in which there are rapidly varying output amplitudes. It is known in the art to address the need for such efficient operation using two techniques. A first technique is known as envelope tracking (ET), and a second technique is known as envelope elimination and restoration (EER). These techniques have required the development of a power supply requiring the efficient provision of a wide output range where the output voltage is expected to show rapid and large signal variations, in addition to variations in the load current.

A typical switch mode implementation is to include a highly non-linear switching block inside a feedback loop, such that the output is effectively linearised by the feedback for signals at a frequency much less than the switching frequency. There are three commonly used methodologies for switch mode implementations: i) Pulse Width Modulation (PWM); ii) Hysteretic (also known as Bang Bang); and iii) Delta Sigma.

A typical PWM technique comprises providing a ramp that is initiated at the start of each clock cycle. At the start of each clock cycle the switch output is set to be "1". When the ramp crosses the signal, the signal output switches to "0". This means that over a single cycle, the average of the output signal is equal to the control inputs, resulting in quasi-linear operation that provides inherently accurate tracking. Conventional PWM algorithms begin to fail when there is a significant change of signal level within one ramp cycle. When the signal changes rapidly, the quasi-linearity is lost and the function becomes a unit level quantiser with delay. This increased delay can result in large signal limit cycle oscillations occurring with wide bandwidth loops.

One problem of prior art techniques is to provide good switching accuracy at large bandwidths. One solution is to increase the switching rate. This means that switcher states are updated at a faster rate and hence are more able to follow fast changing signals.

However when the switched mode supply is implemented using CMOS technology, the switching elements have to be made large enough to pass the required current. Energy is consumed from the supply to switch the large bank of transistors, and this energy is proportional to switcher update rate. A more complicated controller is therefore justified if it increases the number of small geometry devices while simultaneously reducing the number of switching rates at the large transistor banks.

With reference to FIG. 1a, there is illustrated an example output achieved for an exemplary input in a known PWM arrangement. FIG. 1a illustrates the input and output signals over two cycles, cycle 1 between time $t_0$ and $t_1$, and cycle 2 between time $t_1$ and $t_2$. The time instances $t_0$, $t_1$, $t_2$ represent time instances at which there are successive rising edges of a clock signal. FIG. 1a illustrates a simple example in which the output voltage level can switch between one of two levels, V0 and V1. V0 may be a ground level, and V1 may be a positive voltage level. The input signal waveform is identified by reference number 1012. The output signal is identified by reference numeral 1002.

As illustrated in FIG. 1a, in the first cycle there is illustrated a rising ramp 1004, which rises from voltage V0 at time $t_0$ to voltage V1 at time $t_1$. Similarly in cycle 2 there is a rising ramp 1006 which raises from voltage V0 at time $t_1$ to the voltage V1 at time $t_2$. The output starts at voltage V1, and also starts each subsequent cycle at voltage V1.

With further reference to FIG. 1a, when the rising ramp signal 1004 crosses the falling input signal 1012, as denoted by reference numeral 1008, the output 1002 is transitioned to the voltage level V0. The output signal 1002 remains at voltage V0 until the end of the cycle at time $t_1$, at which time the output is forced to voltage V1 for the start of the second cycle. In the second cycle when the rising ramp at 1006 crosses the falling input signal 1012, as indicated by reference numeral 1010, a transition to voltage V0 again occurs. The operation continues in this way.

As can be seen from FIG. 1a, the output signal 1002 is a poor representation of the input signal 1012. A problem in achieving an accurate representation of the original signal is that the PWM process can very accurately replicate the time instant of the falling edge of the waveform, but cannot replicate the rising edge of the waveform at all. The only way in which a rising edge can be carried forward is by setting the voltage to a fixed level, V1, at the beginning of each cycle.

With reference to FIG. 1b, it can be seen that when applying the conventional PWM technique to a multi-level buck converter, the accuracy for fast transitions degrades further.

With reference to FIG. 1b, there is again shown the input signal and output signal over a two cycle period from time $t_0$ to time $t_2$. In this multi-level example, the output signal can switch between one of five voltage levels: V0, V1, V2, V3, V4. The input signal waveform is denoted by reference numeral 2012, and the output signal is denoted by reference numeral 2002.

In this example, at the beginning of the first cycle the output voltage is at voltage level V1.

As shown in FIG. 1b, there is a ramp in each cycle for each of the voltage bands (five voltages providing four voltage bands). Thus in each cycle, for each band, the ramp starts at the lower voltage of the band, and terminates at the end of the cycle at the higher voltage of the band.

Immediately at the start of the cycle, a rising ramp 2011, being the ramp associated with the first band (between voltage levels V0 and V1) of the first cycle crosses the falling input signal 2012, and thus the output signal immediately transitions to voltage V0.

If the input signal is rising faster than the ramp, then quasi-linear PWM operation is not possible. This limit is reached when a slew rate of one full transition in (n−1) clock cycles, where n is the number of voltage levels. Therefore one full cycle of signal cannot be processed in less than pi*(n−1)

clock cycles. For four voltage levels, the maximum bandwidth is one tenth of the clock rate.

At time $t_1$ the voltage transitions to the highest voltage level V4 as this is the voltage level which most closely approximates the input signal waveform at that time. Thereafter the falling input signal 2012 crosses the rising ramp between voltage levels V3 and V4 of the second cycle at a given time, as denoted by reference numeral 2010, and at that time the output voltage is transitioned to the lower voltage level V3.

In a typical prior art PWM technique only a single transition is permitted in a given cycle, and thus once the transition from V4 to V3 takes place, the output signal remains at level V3 for the remainder of the cycle.

As can be seen from FIG. 1b, as there is no quasi-linear operation a substantial error is incurred.

The above described PWM technique incorporates the conventional method of obtaining PWM in which the ramp rises across the clock cycle, and the output signal is at an upper voltage level at the start of each cycle. This reproduces only falling edges.

The inverse to the conventional method for obtaining a PWM signal is that in which the ramp falls across the clock cycle, and the output waveform at the start of a cycle is set to the lower voltage level. This reproduces only rising edges.

It is an aim of the present invention to provide an improved switch mode voltage supply in which an accurate tracking of an input signal is provided.

SUMMARY OF THE INVENTION

In accordance with embodiments of the present invention there is provided a pulse width modulation technique in which rising edges and falling edges of a signal are reproduced. In embodiments the modified pulse width modulation technique incorporates simultaneous rising ramps and falling ramps. The output pulse width modulation transitions are preferably decoupled or independent from the pulse width modulation clock cycle. The output pulse width modulation transitions are thus preferably dependent only upon the input signals crossing the rising and falling ramps.

In one aspect the invention provides a method of generating a pulse width modulated, PWM, signal representing a time-varying signal, the method comprising, for each time cycle: a) generating a rising ramp from a first voltage level to a second voltage level; b) generating a falling ramp from the second voltage level to the first voltage level; c) detecting a rising slope of the time-varying signal crossing the falling ramp and responsive thereto if the PWM signal is at the first voltage level, transitioning the PWM signal to the second voltage signal; d) detecting a falling slope of the time-varying signal crossing the rising ramp, and responsive thereto if the PWM signal is at the second voltage level, transitioning the PWM signal to the first voltage signal.

The method may further comprise, for each time cycle, inhibiting the step of transitioning the PWM signal to the second voltage signal for a second or subsequent detection of a rising slope of the time-varying signal crossing the falling ramp.

The method may further comprise, for each time cycle, inhibiting the step of transitioning the PWM signal to the first voltage signal for a second or subsequent detection of a falling slope of the time-varying signal crossing the rising ramp.

The method may further comprise generating a multi-phase PWM signal, wherein steps a) to d) are performed for each phase to generate an intermediate PWM signal for each phase, the method further comprising the step of generating the PWM signal representing the time-varying signal by summing the intermediate PWM signals.

The method may further comprise generating a multi-level PWM signal, wherein each level has a respective first voltage level and a second voltage level, wherein the steps are performed for each level.

The method may further comprise maintaining the voltage level of the PWM signal on transition between time cycles.

The step of detecting a rising slope of the time-varying signal crossing the falling ramp or detecting a falling slope of the time-varying signal crossing the rising ramp may comprise: generating a first current representing the first voltage level; generating a second ramp representing the second voltage level; subtracting the one current from the other to provide a ramp control signal for controlling the step of generating the rising ramp or the falling ramp; generating a reference current representing the time-varying signal; subtracting either the first or second current from the reference current to provide a comparison signal; and comparing the comparison signal with the generated ramp signal.

For detecting the rising slope of the time-varying signal crossing the falling ramp the comparator may compare the reference current with the inverse of the falling ramp.

For detecting the falling slope of the time-varying signal crossing the rising ramp the comparator may compare the inverse of the reference current with the rising ramp.

In this aspect, the invention also provides a pulse width modulator, PWM, for generating a signal representing a time-varying signal, comprising: a) a ramp generator for generating a rising ramp from a first voltage level to a second voltage level; b) a ramp generator for generating a falling ramp from the second voltage level to the first voltage level; c) a detector for detecting a rising slope of the time-varying signal crossing the falling ramp and responsive thereto if the PWM signal is at the first voltage level, transitioning the PWM signal to the second voltage signal; and d) a detector for detecting a falling slope of the time-varying signal crossing the rising ramp, and responsive thereto if the PWM signal is at the second voltage level, transitioning the PWM signal to the first voltage signal.

The means for detecting a rising slope of the time-varying signal crossing the falling ramp or the means for detecting a falling slope of the time-varying signal crossing the rising ramp may comprise: a current generator for generating a first current representing the first voltage level; a current generator for generating a second ramp representing the second voltage level; a subtractor for subtracting the one current from the other to provide a ramp control signal for controlling the means generating the rising ramp or the falling ramp; a current generator for generating a reference current representing the time-varying signal; a subtractor for subtracting either the first or second current from the reference current to provide a comparison signal; and a comparator for comparing the comparison signal with the generated ramp signal.

The means for detecting the rising slope of the time-varying signal crossing the falling ramp may be adapted to connect the comparator to compare the reference current with the inverse of the falling ramp.

The means for detecting the falling slope of the time-varying signal crossing the rising ramp may be adapted to connect the comparator to compare the inverse of the reference current with the rising ramp.

An envelope tracking modulator for a mobile radio transmission apparatus may include a pulse width modulator as defined.

In another aspect the invention provides a method of generating a pulse width modulated, PWM, signal representing a time-varying signal, the method including the steps of: generating a first current in dependence on a first voltage level; generating a second current in dependence on a second voltage level; subtracting one current from the other to provide a ramp control signal; generating a ramp between the first and second voltage levels in dependence on the ramp control signal; generating a reference current in dependence on the time-varying signal; subtracting either the first or second current from the reference current to provide a comparison signal; and comparing the comparison signal with the generated ramp signal to detect the transition of the time-varying signal and the ramp in opposite directions.

The method may further include the step of transitioning the PWM signal to the first or second voltage level in response to detection of the transition of the time-varying signal and the ramp in opposite directions, and if the PWM signal is at the second or first voltage level respectively.

The first voltage level may be a lower voltage level and the second voltage level may be an upper voltage level, the ramp being a rising ramp generated from the lower voltage level to the upper voltage level, the method further including, responsive to detection of a transition of a falling slope of the time-varying signal with the rising ramp and in dependence on the PWM signal being at the upper level, transitioning the PWM signal from the upper level to the lower level.

The first voltage level may be an upper voltage level and the second voltage level may be a lower voltage level, the ramp being a falling ramp generated from the upper voltage level to the lower voltage level, the method further including, responsive to detection of a transition of a rising slope of the time-varying signal with the falling ramp and in dependence on the PWM signal being at the lower level, transitioning the PWM signal from the lower level to the upper level.

The step of generating a ramp may comprise: generating a rising ramp between the first and second voltage levels in dependence on the ramp control signal; and generating a falling rampe between the first and second voltage levels in dependence on the rampe control signal, and further the step of comparing may comprise: comparing the comparison signal with the generated rising ramp to detect a transition of a falling edge of the time-varying signal with the rising ramp; and comparing the comparison signal with the generated falling ramp to detect a transition of a rising edge of the time-varying signal with the falling ramp.

Responsive to detection, in said comparing step, a transition of a falling edge of the time-varying signal with the rising ramp, and in dependence on the PWM signal being at the second voltage level, the PWM signal may be transitioned to the first voltage level.

Responsive to detection, in said comparing step, a transition of a rising edge of the time-varying signal with the falling ramp, and in dependence on the may be transitioned to the second voltage level.

The step of generating a ramp between first and second voltage levels may take place in a time cycle.

Said steps may be repeated in successive time cycles, the method further comprising carrying forward the PWM state at the end of one time cycle to the beginning of a following time cycle.

In this aspect the invention also provides a pulse width modulator including: a current generator for generating a first current in dependence on a first voltage level; a current generator for generating a second current in dependence on a second voltage level a subtractor for subtracting one current from the other to provide a ramp control signal; a ramp generator for generating a ramp between the first and second voltage levels in dependence on the ramp control signal; a current generator for generating a reference current in dependence on the time-varying signal; a subtractor for subtracting either the first or second current from the reference current to provide a comparison signal; and a comparator for comparing the comparison signal with the generated ramp signal to detect the transition of the time-varying signal and the ramp in opposite directions.

The ramp generator may comprise: a ramp generator for generating a rising ramp between the first and second voltage levels in dependence on the ramp control signal; and a ramp generator for generating a falling ramp between the first and second voltage levels in dependence on the ramp control signal, and further the comparator may comprise: a comparator for comparing the comparison signal with the generated rising ramp to detect a transition of a falling edge of the time-varying signal with the rising ramp; and a comparator for comparing the comparison signal with the generated falling ramp to detect a transition of a rising edge of the time-varying signal with the falling ramp.

The pulse width modulator may be further adapted to, responsive to detection, in a comparator, of a transition of a falling edge of the time-varying signal with the rising ramp, and in dependence on the PWM signal being at the second voltage level, transition the PWM signal to the first voltage level. The pulse width modulator may be further adapted to, responsive to detection, in a comparator, of a transition of a rising edge of the time-varying signal with the falling ramp, and in dependence on the PWM signal being at the first voltage level, transition the PWM signal to the second voltage level.

The pulse width modulator may be further adapted to carry forward the PWM state at the end of one time cycle to the beginning of a following time cycle.

An envelope tracking modulator for a mobile radio transmission apparatus may including a pulse width modulator as defined.

BRIEF DESCRIPTION OF THE FIGURES

The invention will now be described by way of example with reference to the accompanying figures in which:

FIGS. 1a and 1b illustrate the disadvantages associated with prior art pulse width modulation techniques;

DESCRIPTION OF THE PREFERRED EMBODIMENTS

The invention will now be described by way of example with reference to its application in various embodiments. One skilled in the art will appreciate that the invention is not limited in its scope to the specifics of implementation details of any particular embodiment.

Figure 1B:
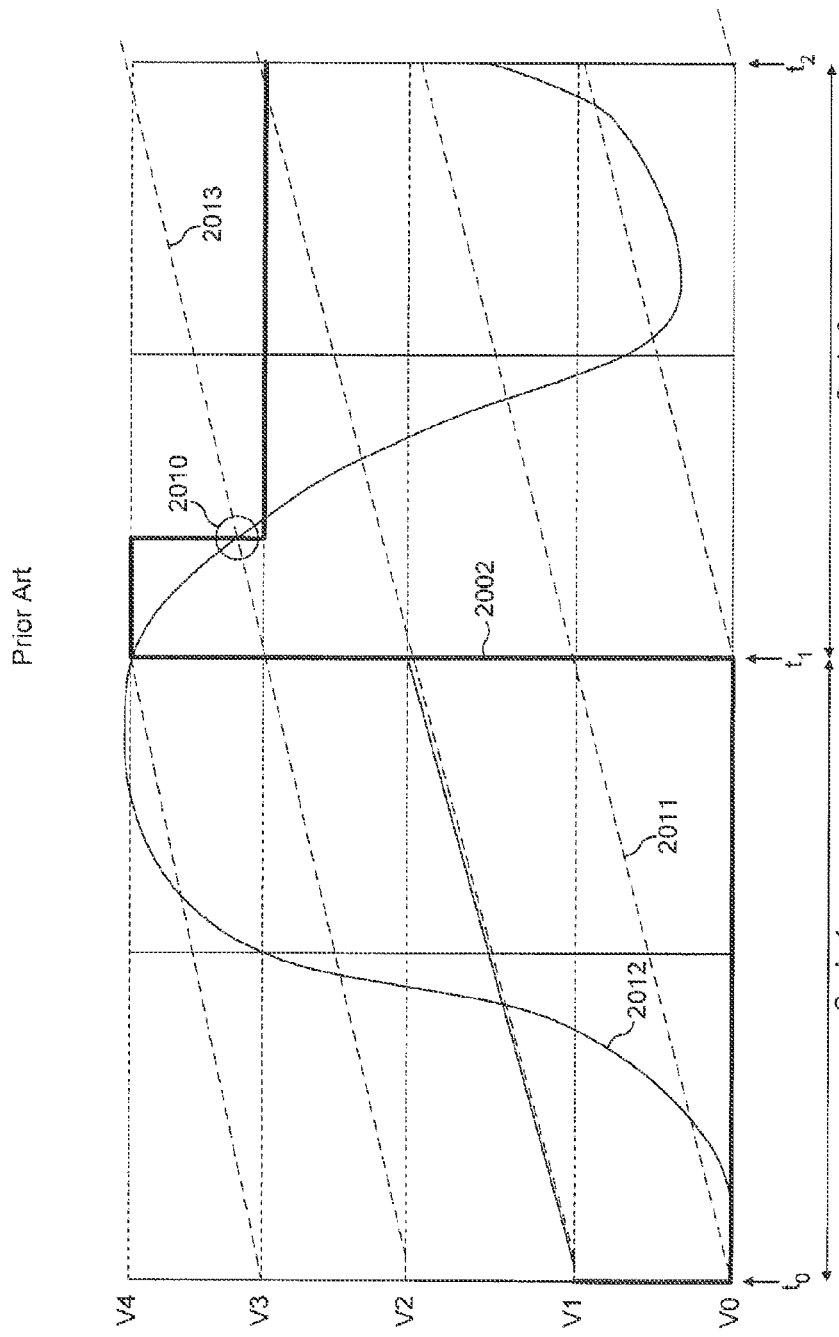
Figure 2:
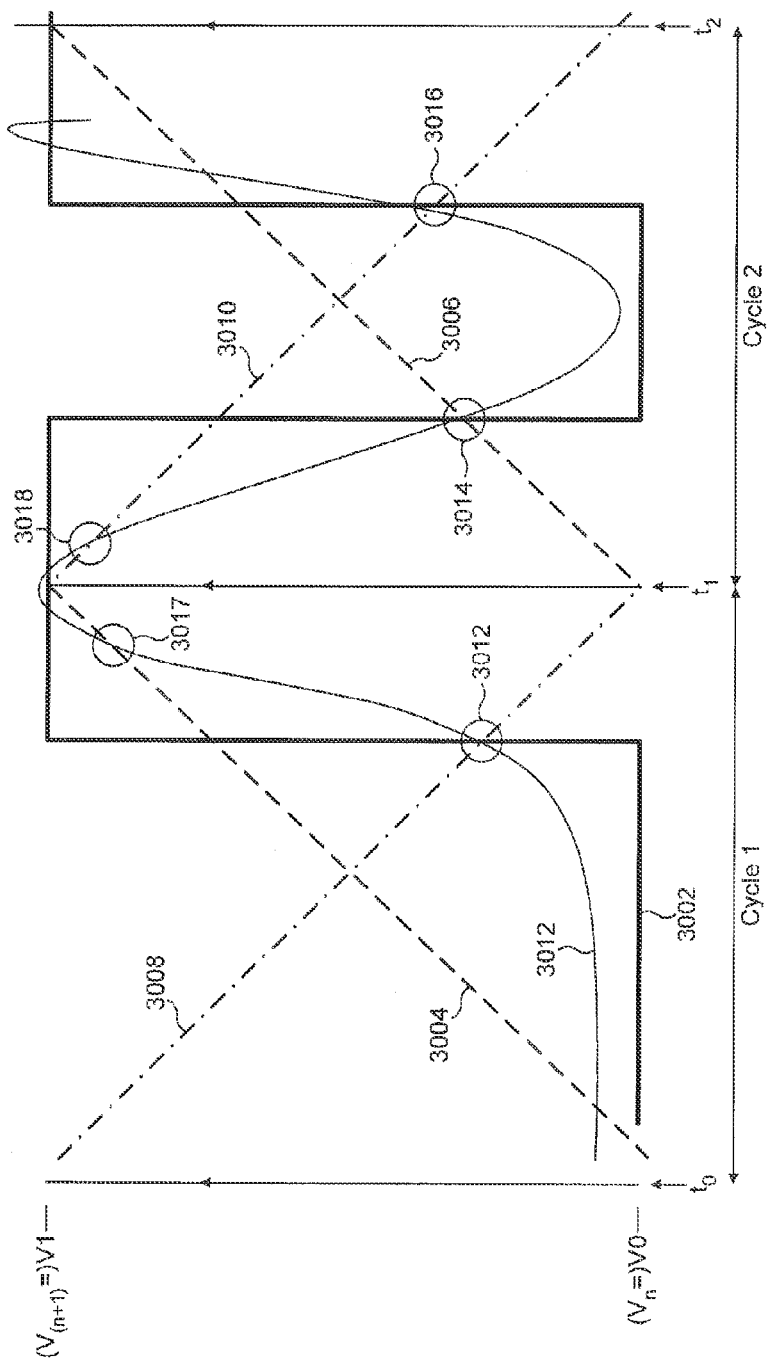
FIG. 2 illustrates the principles of the present invention in accordance with preferred embodiments.

With reference to FIG. 2, the principles of embodiments of the present invention can be understood. A series of ramp pairs are simultaneously initiated, a first ramp of a pair from $V_n$ to $V_{(n+1)}$, and a second ramp of a pair from $V_{(n+1)}$ to $V_n$.

In general, when the signal to be encoded crosses a falling ramp in an upward direction, the output of the stage is set to the high voltage level ($V_{n+1}$). When the signal crosses the falling ramp in a downward direction no action takes place. The encoded signal remains at the high level until the signal crosses a rising ramp in a downward direction. In general, when the signal to be encoded crosses a rising ramp in a downward direction, the output of the stage is set to the low voltage level ($V_n$). The signal to be encoded crossing a rising ramp in an upward direction results in no action being taken.

The implementation may be modified so as to allow only one action to be taken in respect of a given ramp in a given clock cycle, or to allow multiple actions to be taken in a given ramp in a given clock cycle. Where multiple actions are enabled, the encoded signal will only change state responsive to the signal to be encoded crossing the ramp in a direction which causes a change of state.

In the embodiments described hereinbelow, for simplification of explanation, it is assumed that only one transition for a given ramp is permitted per cycle.

In an arrangement in which the encoded signal is allowed to change within a single cycle responsive to multiple transitions across a given ramp, a pulse width modulated hysteretic method is obtained.

In addition to the encoded signal changing state responsive to the signal to be encoded crossing both rising and falling ramps in a given cycle, preferably the state of the encoded signal at the end of any clock cycle is carried over to the beginning of the next clock cycle, rather than being reset as in prior art pulse width modulated arrangements. Thus changes in the state of the encoded signal are only responsive to transitions of the signal to be encoded with respect to the ramps, and not to the boundary of successive cycles. This has the advantage that information is conveyed throughout the process on both transitions rather than just one, effectively doubling the sampling rate.

Whilst the techniques of the invention may be utilised in combination with an arrangement in which the output level is reset to a default on clock cycle boundary transitions, it is preferable not to do so. An arrangement in which resetting at the clock boundaries is implemented does not give minimal switch transitions for a given information transfer state.

The principle of the invention is now discussed in more detail with further reference to FIG. 2. FIG. 2 illustrates conceptually a preferred implementation of the invention in a single phase, single-level embodiment. With reference to FIG. 2, there is illustrated an input waveform 3012 over two time cycles, cycle 1 and cycle 2. The time cycle 1 begins at time $t_0$ and ends at time $t_1$. Cycle 2 begins at time $t_1$ and ends at time $t_2$. In the single-level example of FIG. 2, the output signal 3002 may transition between two exemplary voltage levels, a lower voltage level V0 and an upper voltage level V1. In general the lower and upper voltage levels may respectively be denoted by $V_n$ and $V_{(n+1)}$. In the first cycle, a rising ramp 3004 starts at time $t_0$ at voltage level V0, and rises to voltage level V1 at time $t_1$. A falling ramp starts at time $t_0$ at voltage level V1, and falls to voltage level V0 at time $t_1$. A similar rising ramp 3006 is provided in the second cycle, and a similar falling ramp 3010 is provided in the second cycle.

In the illustrated embodiment, there is an adaptation such that the output signal transitions on a crossover point of (i) a rising input signal with a falling ramp, or (ii) a falling input signal with a rising ramp. In this way a pulse width modulated signal is obtained which is an accurate representation of the input signal.

Thus, as illustrated in FIG. 2, the output signal begins the first cycle at the voltage level V0. The input signal 3012 crosses the falling ramp 3008 at a point denoted by reference numeral 3012, and the output signal 3002 then transitions to the voltage level V1.

As denoted by reference numerals 3017 and 3018, there is no transition in the output signal if the rising input signal crosses a rising ramp, or the falling input signal crosses a falling ramp.

As also can be seen from FIG. 2, at time $t_1$ which represents a boundary between clock cycles, the output is not reset, and the output value carries over into the next clock cycle.

As further illustrated in FIG. 2 in the second cycle, as denoted by reference numeral 3014, the falling input signal 3012 crosses the rising ramp 3006, and thus the output signal transitions to the voltage level V0. Thereafter, as further denoted by reference numeral 3016, the rising input signal crosses the falling ramp 3010, and the output voltage 3002 transitions to the voltage level V1.

Thus, as can be clearly seen in FIG. 2, the output signal 3002 closely follows the shape of the input signal 3012.

Figure 3:
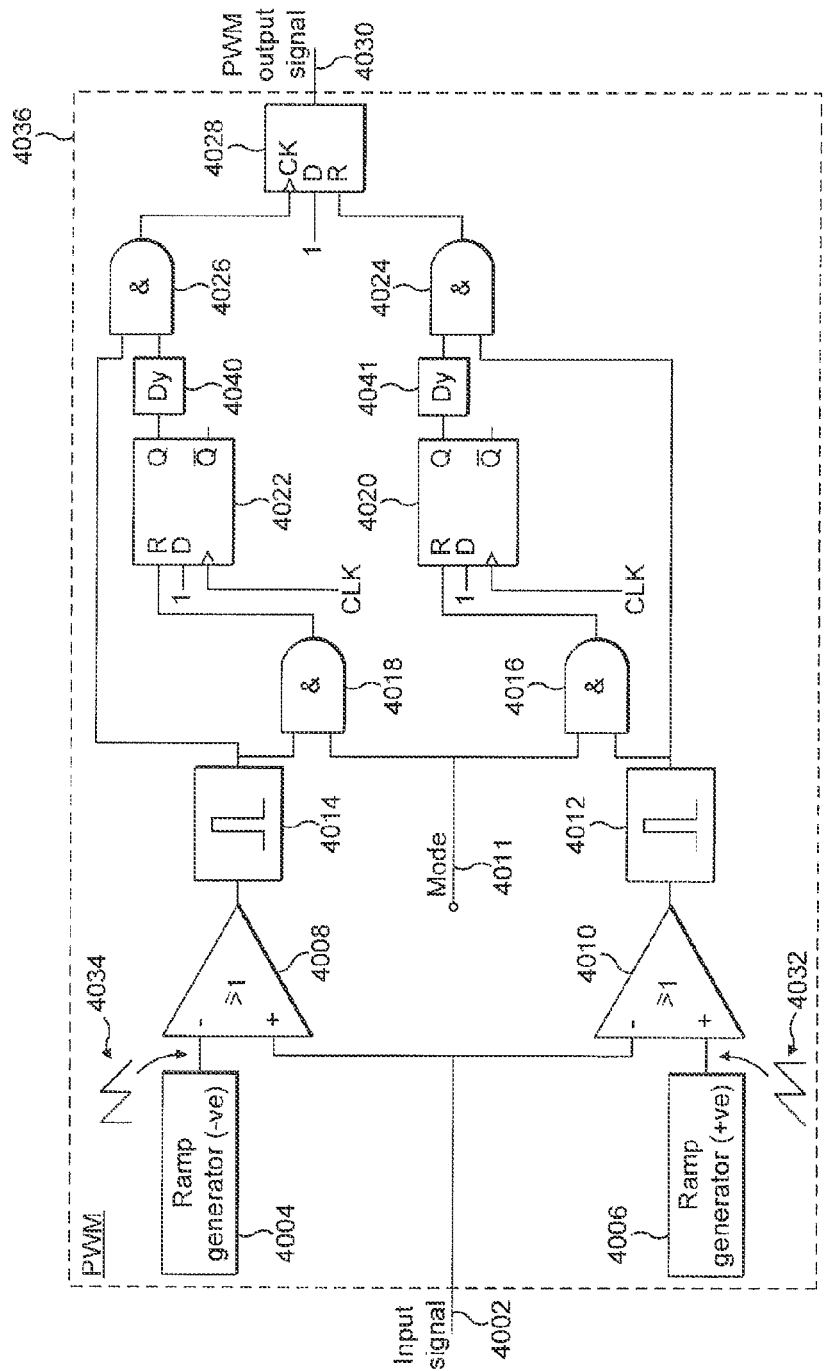
FIG. 3 illustrates a schematic of an apparatus for implementing an embodiment of the invention.

With reference to FIG. 3 there is illustrated an exemplary schematic implementation for an arrangement for generating a pulse width modulated output signal, in dependence on a time varying input signal, in accordance with the principles of FIG. 2.

A pulse width modulator in accordance with an embodiment of the invention is generally illustrated by reference numeral 4036. Included in the pulse width modulator 4036 is a first comparator 4008, a second comparator 4010, a first ramp generator 4004, a second ramp generator 4006, a first one-shot narrow pulse generator 4014, a second one-shot narrow pulse generator 4012, a first AND gate 4018, a second AND gate 4016, a first D-type flip-flop 4022, a second D-type flip-flop 4020, a first delay stage 4040, a second delay stage 4041 a third AND gate 4026, a fourth AND gate 4024 and an asynchronously resettable D-type flip-flop 4028.

An input signal to the pulse width modulator 4036 is provided on line 4002, such as the input signal 3012 of FIG. 2, and a pulse width modulated output signal is generated on line 4030, such as the output signal 3002 of FIG. 2.

Each of the comparators 4008 and 4010 has a negative input and a positive input, and an output. The first comparator 4008 has its negative input connected to the output of the ramp generator 4004. The ramp generator 4004 is a negative ramp generator. An illustration of the ramp provided by the ramp generator 4004 is denoted by reference numeral 4034. The positive input of the comparator 4008 is provided by the input signal on line 4002. The second comparator 4010 receives at its positive input the output of the second ramp generator 4006. The ramp generator 4006 generates a positive going ramp. The positive going ramp is illustrated by a waveform in FIG. 3 denoted by reference numeral 4032. The negative input of the comparator 4010 is provided by the input signal on line 4002. The output of the first comparator 4008 forms an input to the first one-shot narrow pulse generator 4014, and the output of the second comparator 4010 forms an input to the second one-shot narrow pulse generator 4012.

The first AND gate 4018 receives as a first input the output of the first one-shot narrow pulse generator 4014, and as a second input a mode control signal on line 4011. The second AND gate 4016 receives as a first input the output of the second one-shot narrow pulse generator 4012, and as a second input the mode control signal on line 4011. The output to the AND gate 4018 forms an input to the reset input of the first D-type flip-flop 4022. The output of the AND gate 4016 forms an input to the reset input of the second D-type flip-flop 4020.

Each of the D-type flip-flops 4022 and 4020 has the D input held high at logic 1. A clock signal CLK is provided to the clock input of each flip-flop. The non-inverted output, Q, of each D-type flip-flop is used as the output of the flip-flop, the inverted output not being used.

The third AND gate 4026 receives as a first input the output of the first one-shot narrow pulse generator 4014, and as a second input the delayed non-inverted output of the D-type flip-flop 4022 via the delay stage 4040. The fourth AND gate 4024 receives as a first input the output of the second one-shot narrow pulse generator 4012 and as a second input the delayed non-inverted output of the D-type flip-flop 4020 via the delay stage 4041.

The output of the third AND gate 4026 forms an input to the clock input of the D-type flip-flop 4028. The output of the AND gate 4024 forms an input to the asynchronous reset input, R, of the D-type flip-flop 4028. The D input of the D-type flip-flop 4028 is held high at logic 1.

The output of the D-type flip-flop 4028 provides the pulse width modulated output signal on line 4030.

The operation of the pulse width modulator 4036 of FIG. 3 to provide a pulse width modulated output signal in accordance with the principles of FIG. 2 is now further described.

Each of the comparators 4008 and 4010 receives the input signal and is also responsive to a dedicated ramp signal. The provision of a negative going ramp to the comparator 4008 makes it responsive to the negative going ramp at its negative input and the input signal at its positive input such that when the input signal crosses the negative going ramp the comparator output goes positive. The connection of the positive going ramp to the positive input of the comparator 4010 in combination with the connection of the input signal to the negative input of the comparator 4010 results in the output of the comparator 4010 going positive when the input signal crosses the positive going ramp from a positive direction.

Responsive to the output of either comparator 4008 or 4010 going positive, a one-shot narrow pulse is generated by the respective one-shot narrow pulse generator 4014 and 4012. The width of the pulse is not important, the purpose being to generate an edge denoting a transition.

In general, a pulse generated by the one-shot narrow pulse generator 4014 sets the output register 4028, and a pulse generated by the one-shot output pulse generator 4012 resets the register 4028. In this way the output signal of the output register transitions between two levels, and the pulse width modulated output signal is generated on line 4030.

In accordance with the principles of the described embodiment, one transition in either direction is desired to be obtained per clock cycle. In other embodiments, multiple transitions per clock cycle may be allowed.

In order to implement the limitation to a single transition, it is necessary for the pulses generated by the one-shot narrow pulse generators 4014 and 4012 to be gated. For this purpose the mode control signal 4011 is provided in combination with the AND gates 4018 and 4016, and the D-type flip-flops 4022 and 4020.

If the mode control signal on line 4011 is high, the AND gates 4018 and 4016 will simply propagate the one-shot narrow pulse from the respective pulse generators 4014 and 4012 to reset the respective D-type flip-flops 4022 and 4020. D-type flip-flop 4022 will be reset for positive going inputs and D-type flip-flop 4020 will be reset for negative going inputs. The respective flip-flops 4022 and 4020 deactivate the AND gates 4026 and 4024 to prevent further pulse propagation before the end of a cycle. The delay stages 4040 and 4041 are provided to ensure that the wanted pulse is allowed to propagate.

The flip-flops 4022 and 4020 are set by the clock at the end of a pulse width modulation cycle to allow pulse propagation to resume for the next cycle.

The mode control signal may deactivate the AND gates 4018 and 4016 to allow the D-type flip-flop 4028 to change state an unlimited number of times during one cycle. This allows the pulse width modulator 4036 to operate in a hybrid PWM-hysteretic mode. The mode control signal on line 4011 thus determines whether single transitions or multi transitions are allowed for a given ramp in a given time frame.

FIGS. 2 and 3 illustrate an embodiment of the invention for a single-phase single-level exemplary implementation. With reference to FIGS. 4a to 4d there is illustrated an exemplary implementation in a dual-phase arrangement. In such an arrangement, two ramp sets are provided for each cycle, each ramp set being associated with a particular phase. In a dual-phase arrangement, each ramp set is preferably offset from the other by 180 degrees.

Figure 4A:
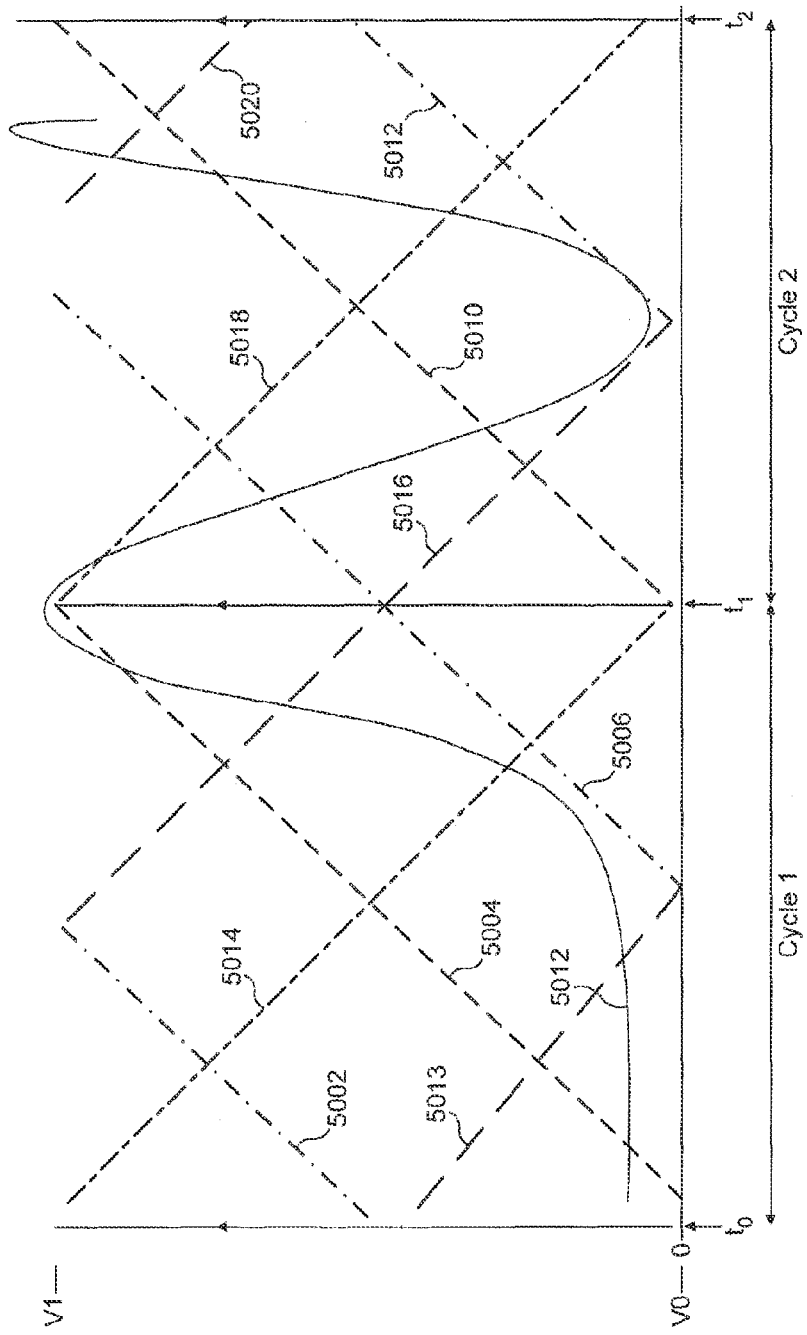
FIGS. 4a to 4d illustrate the operation of the invention in accordance with an embodiment.

With reference to FIG. 4a, in the first cycle between time $t_0$ and $t_1$ there is illustrated a first rising ramp denoted by reference numeral 5004. This ramp corresponds to the rising ramp 3004 of FIG. 2, corresponding to a phase of zero degrees. In addition there is provided two further rising ramps denoted by reference numerals 5002 and 5006, denoting positive going ramps at phase differences of +/−180 degrees. Similarly in the first cycle there is a falling ramp denoted by reference numeral 5014, which corresponds to the ramp 3008 of FIG. 2 and denotes the falling ramp at a phase of zero degrees. In addition there is provided two further falling ramps, denoted by reference numerals 5013 and 5016, and representing falling ramps at phases of +/−180 degrees. For the second cycle and subsequent cycles similar ramps are provided. Thus in the second cycle there is a rising ramp 5010 and a falling ramp 5018 at a phase of zero degrees. The rising ramp 5006 at a phase offset of 180 degrees from the first cycle extends into the second cycle. The falling ramp at 5016 at a phase offset of 180 degrees extends into the second cycle. An additional rising ramp 5012 at an offset of 180 degrees and an additional falling ramp 5020 at an offset of 180 degrees are also illustrated in FIG. 4a.

In this embodiment, two outputs are created which are the result of having two ramp sets for each cycle. Each output is offset from the other by 180 degrees. The PWM output signal is then generated in dependence on the average of the two signals resulting from the two sets of ramps. This further improves tracking accuracy of the output pulse width modulator signal to the input signal. The generation of an output signal using a two-phase arrangement in accordance with FIG. 4a is now further described with reference to FIGS. 4b to 4d.

Figure 4B:
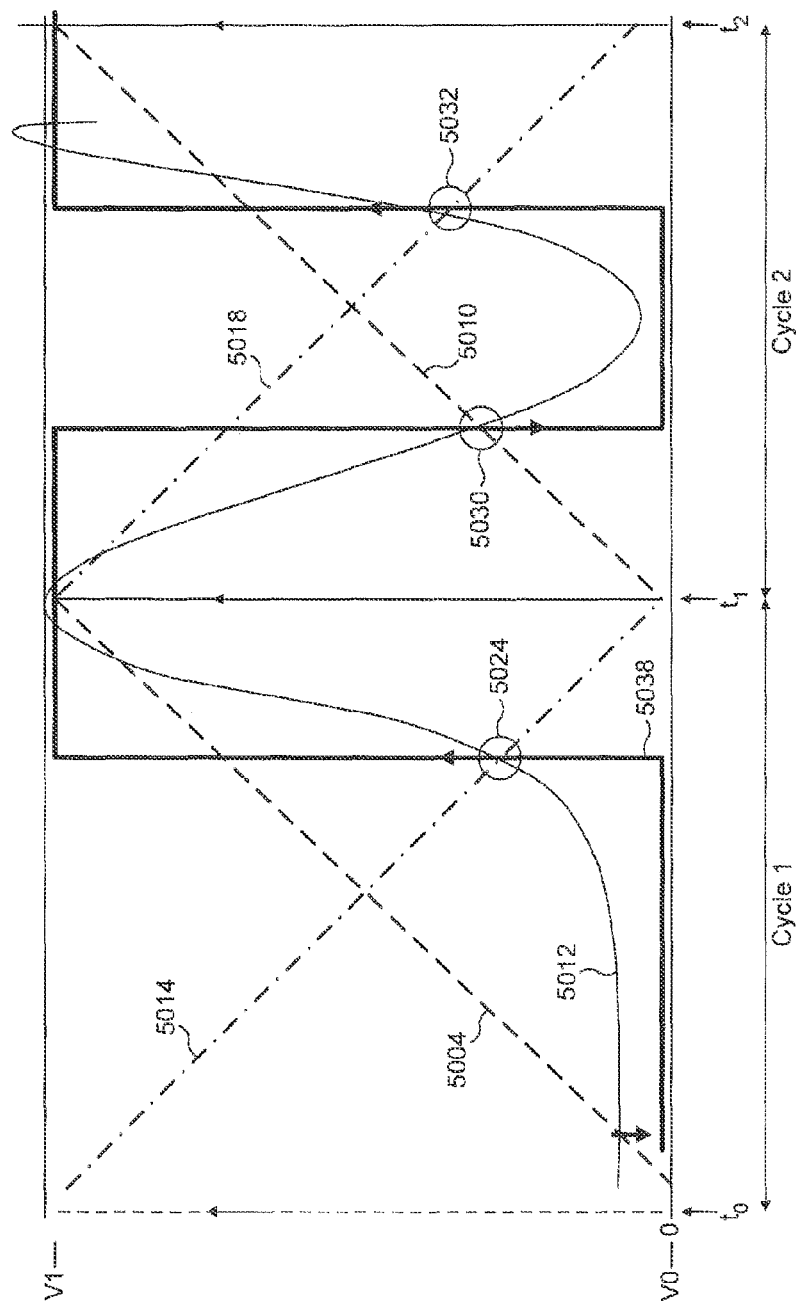

With reference to FIG. 4b, there is illustrated the generation of an output signal solely in dependence on the rising and falling ramps at a phase of zero degrees. As can be seen by comparing FIG. 4b to FIG. 2, for the same input signal as FIG. 2 this results in the generation of the same output signal as FIG. 2. In each of FIGS. 4a to 4d the input signal is denoted by reference numeral 5012. As illustrated in FIG. 4b, a first output signal, which may be considered to be a first intermediate output signal, 5038, is generated. As the rising input signal 5012 crosses the falling ramp 5014, at a location denoted by reference numeral 5024, the output signal 5038 rises from the voltage level V0 to the voltage level V1. As the falling input signal 5030 crosses the rising ramp 5010 in the second cycle, the output signal 5038 transitions to the lower voltage V0. As the rising input signal crosses the falling ramp 5018 of the second cycle the output voltage 5038 again transitions to the voltage level V1. Thus the output signal 5038, being a first intermediate output signal, is generated in dependence upon the input signal in a corresponding manner to the generation of the output signal 3002 in dependence on the input signal 3012 in FIG. 2.

Figure 4C:
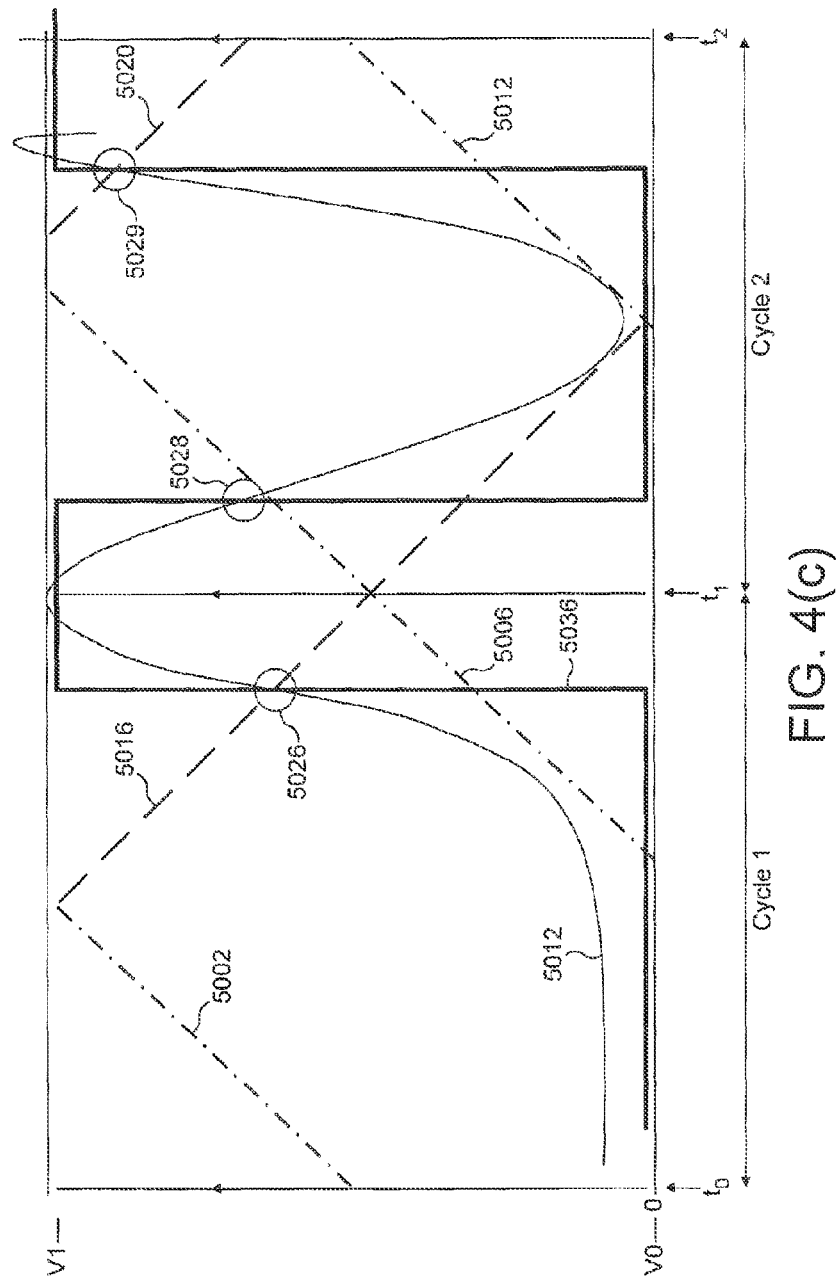

With reference to FIG. 4c, there is illustrated the generation of a second intermediate output signal in dependence on the input signal, at a phase offset of +/−180 degrees. Thus in FIG. 4c only the rising and falling ramps associated with the 180 degree phase difference are illustrated. As illustrated in FIG. 4c, at a location denoted by reference numeral 5026 of the first cycle the rising input signal 5012 crosses the falling ramp 5016 and the second intermediate output voltage transitions from level V0 to level V1. In the second cycle at a location identified by reference numeral 5028 the falling input signal 5012 crosses the rising ramp 5006, and the second intermediate output signal 5036 transitions to voltage level V0. At a further location denoted by reference numeral 5029 of the second cycle the rising input signal 5012 crosses the falling ramp 5020, and the second intermediate output voltage 5036 transitions to voltage level V1.

By consideration of FIGS. 4b and 4c, it will be apparent to one skilled in the art that the principles described hereinabove with reference to FIG. 2 are applied to both scenarios, the difference being that the transitions occur at different points due to the fact that the ramps are generated for different phases.

Figure 4D:
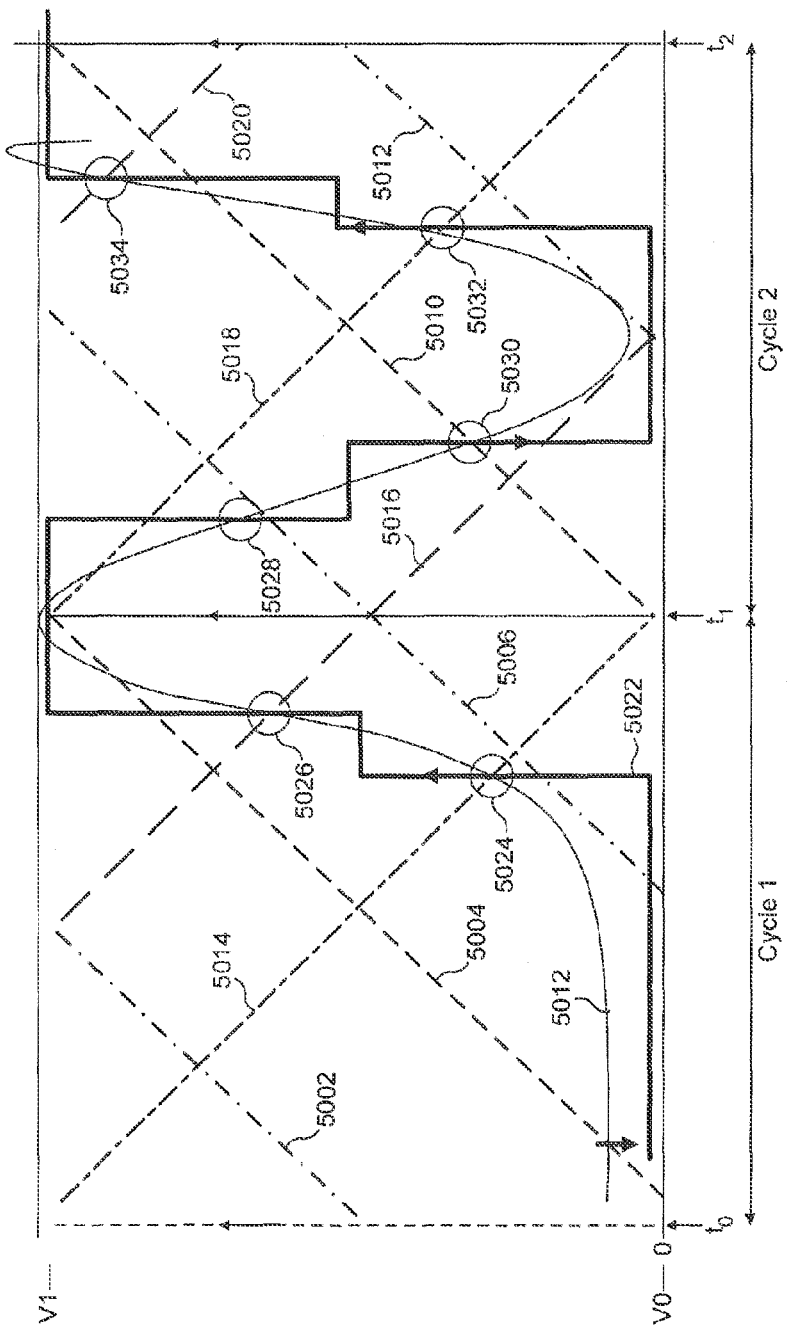

The actual output of a dual-phase pulse width modulator as exemplified is illustrated in FIG. 4d. Reference numeral 5022 denotes the actual output signal, which is the average of the two intermediate output signals for the respective phases, i.e. in this example the average of the output signals 5038 and 5036 of FIGS. 4b and 4c respectively. As can be seen, this results in a yet more accurate representation of the input signal 5012 as a pulse width modulated signal.

Figure 5:
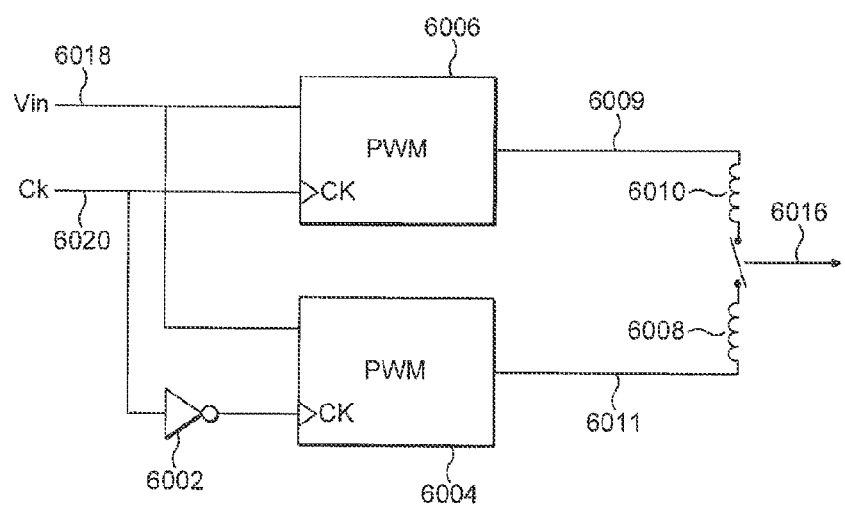
FIG. 5 illustrates schematically an implementation of an embodiment of the invention.

With reference to FIG. 5 there is illustrated an exemplary implementation for a dual-phase pulse width modulator arrangement in accordance with this embodiment.

In a multi-phase implementation the total dimension of switching transistors is the same, but the transition is split up into smaller units that are switched at fixed offsets in time. This means that the switching rate is effectively increased, without incurring the increased losses associated with increased switching frequency. Such an arrangement requires an increase in the number of inductors at the output.

The arrangement includes a first pulse width modulator 6006 and a second pulse width modulator 6004, each of which may be implemented in accordance with the pulse-width modulator arrangement 4036 of FIG. 3. The input voltage 5012 is provided on an input line 6018, and forms an input to each of the pulse width modulators 6006 and 6004. In addition each pulse width modulator 6006 and 6004 receives a clock signal on line 6020. The clock signal on line 6020 is inverted by inverter 6002 before input to the clock input of pulse width modulator 6004, to ensure the phase difference between the two pulse width modulators. The inversion of the clock ensures that the pulse width modulator 6004 operates at a phase difference of 180 degrees relative to the pulse width modulator 6006. The pulse width modulator 6006 generates a first intermediate output at no phase offset on line 6009, for example the intermediate output 5038 of FIG. 4b. The second pulse width modulator 6004 generates a second intermediate output at 180 degree phase offset on line 6011, such as the intermediate output 5036 of FIG. 4c.

The intermediate output signals on line 6009 and 6011 are then summed in an inductor arrangement including an inductor 6010 and an inductor 6008, respectively connected to receive the signals on lines 6009 and 6011. The output of the inductor arrangement is provided on an output line 6016. The output signal on line 6016 is the sum of the two intermediate output signals, and corresponds to the output signal 5022 of FIG. 4d.

The dual-phase arrangement of FIG. 5 may be extended to multi-phase arrangements of a number greater than two. For an n-phase pulse width modulator, n pulse width modulators 4036 of FIG. 3 are provided, with the clock signal to each modulator being appropriately adjusted to provide the necessary phase offset. The output of each of the n pulse width modulators are then summed to provide the output signal. As can be understood from reference to FIGS. 4a to 4d, increasing the number of phases in a multi-phase pulse width modulator arrangement in accordance with embodiments of the invention increases the tracking accuracy of the pulse width modulated output signal relative to the input signal.

Preferably in addition to incorporating multi-phase operation, embodiments of the invention may incorporate multi-level operation. In a multi-level operation the output signal may be transitioned between more than two voltage levels. Again, this increases the tracking accuracy of the pulse width modulated output signal.

A conventional buck-converter switch mode power supply switches between an input voltage level and ground. In a multi-level arrangement, such simple arrangement is modified to switch between a plurality of fixed voltages and ground. The switch is directed to the voltage that is nearest to the wanted voltage at the instant of switching. This means that the voltage switching step can be reduced, increasing efficiency, and greater accuracy of tracking can be achieved. A further advantage is that the dimensions of each switch can be set to the expected current demand when current demand and voltage supply is highly correlated (as in the case of ET and EER).

Figure 6:
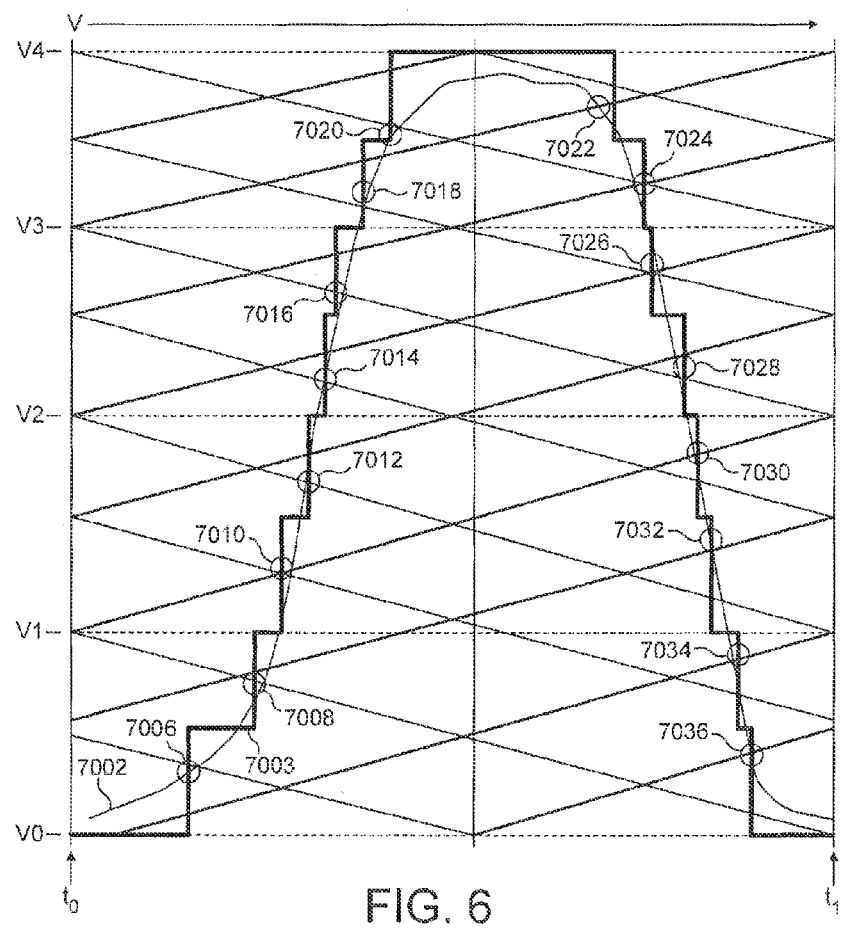
FIG. 6 is a waveform illustrating the advantages of an embodiment of the invention.

With reference to FIG. 6, there is illustrated the advantageous results achieved by implementing a multi-level arrangement in combination with the multi-phase arrangement such as described hereinabove with reference to FIGS. 4a to 4d and FIG. 5. This arrangement is not described in detail herein, since the implementation of the arrangement will be apparent from the foregoing description of a multi-phase arrangement without multi-levels. In this arrangement there is illustrated a five-level arrangement, having voltage levels V0, V1, V2, V3 and V4. The five voltage levels create four voltage bands, being a voltage range between adjacent voltage levels. In FIG. 6 the input waveform is denoted by reference numeral 7002, and the final output pulse width modulator signal is denoted by reference numeral 7003.

As with the multi-phase arrangement described above, FIG. 6 illustrates a dual-phase implementation. Thus the output signal 7003 is obtained by summing intermediate output signals for each of the two phases. In each clock cycle each voltage band has a dual ramp: a rising ramp and a falling ramp. The rising ramp for each band rises from the bottom voltage level of the band to the top voltage level of the band over the course of a cycle. The falling voltage ramp for a band falls from the upper voltage level of the band to the lower voltage level of the band across a clock cycle.

As can be seen from FIG. 6, for an input signal which rises from the bottom voltage level to the upper voltage level across the first cycle, and then falls from the upper voltage level to the lower voltage level across the second cycle, there are two transitions in the output signal for each voltage band on both the rising and falling signal. The transitions of the input signal relative to the various ramps which cause a transition in the output signal are denoted by reference numeral 7006 to 7036 in FIG. 6.

As can be seen from FIG. 6, the introduction of a multi-level arrangement in combination with the multi-phase arrangement results in a still more accurate replica of the input signal in the pulse width modulated output signal.

Although in FIG. 6 the implementation of the multi-level arrangement is shown in combination with the multi-phase arrangement, each of the multi-phase and multi-level arrangements may be implemented independently of each other. Thus an arrangement may implement a single-phase, single-level arrangement; a single-phase, multi-level arrangement; a multi-phase, single-level arrangement; or a multi-phase, multi-level arrangement.

For an arrangement in which the total number of phases is n, the clock offset of each pulse width modulator is preferably 360/n.

As can be seen in the arrangement of FIG. 6, even though the input signal rises up to a full level and falls to the lowest level in a single clock cycle, an accurate representation of the input signal is obtained by the pulse width modulation technique in accordance with embodiments of the invention.

An exemplary implementation for an arrangement to provide an output signal in accordance with FIG. 6 is now described with reference to FIG. 7.

Figure 7:
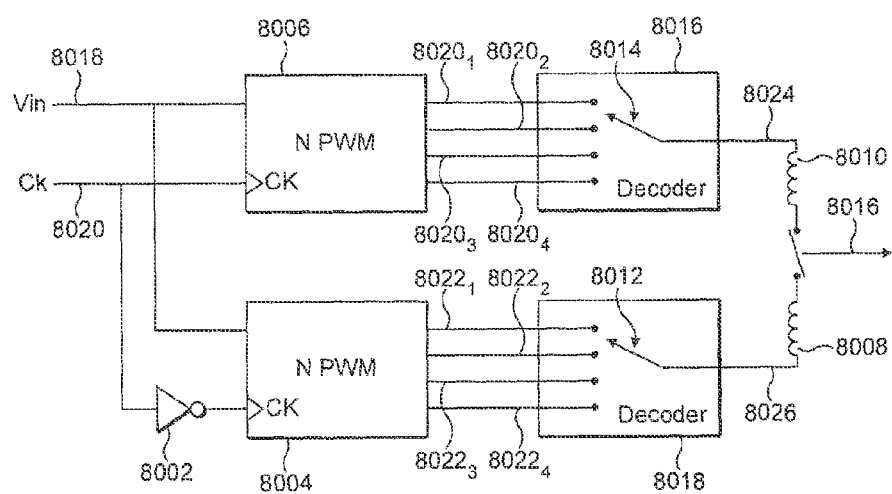
FIG. 7 illustrates schematically an implementation of an embodiment of the invention.

With reference to FIG. 7 there is illustrated a block 8006 which denotes a plurality of pulse width modulators N. Similarly a block 8004 denotes a plurality N of pulse width modulators, such as the pulse width modulator 4036 of FIG. 3. In the exemplary arrangement of FIG. 7, N=4. FIG. 7 thus illustrates a dual-phase, four-level pulse width modulator in accordance with embodiments of the invention.

As discussed hereinabove with reference to FIG. 5, in order to implement the dual-phase aspect of the arrangement it is necessary to provide two pulse width modulators, one clocked directly by the clock signal and one clocked by the inverse of the clock signal. Thus the clock signal on line 8020 is provided to the clock input of the N pulse width modulators 8006, and the inverse of the clock signal on line 8020 is provided by the inverter 8002 to the clock inputs of the N pulse width modulators 8004.

Each of the N pulse width modulators of the blocks 8006 and 8004 is associated with a particular voltage band or level. Thus in an arrangement where there are provided four pulse width modulators in each of the blocks 8006 and 8004, there are provided four output lines. Each pulse width modulator of the block 8006 is 'paired' with a pulse width modulator of the block 8004: one of the pair deals with one phase; the other of the pair deals with the other phase.

The pulse width modulator block 8006, including four pulse width modulators generates four output signals on lines $8020_1$ to $8020_4$. Similarly the block 8004, including four pulse width modulators, generates four output signals on lines $8022_1$ to $8022_4$.

Each of the outputs of the pulse width modulator blocks 8006 and 8004 is provided to a respective decoder block 8016 and 8018. Each decoder block includes a respective switch or set of switches, denoted by reference numeral 8014 and 8012 respectively, which connects one of the respective outputs of the pulse width modulator blocks to an output line 8024 or 8026 respectively. The output signals on lines 8024 and 8026 are then summed using an inductor arrangement including inductors 8010 and 8008 to generate the output signal 8016.

The signals on lines 8024 and 8026 represent intermediate output signals in accordance with the principles described earlier hereinabove with reference to FIG. 5.

The decoder blocks 8016 and 8018 are controlled such that when one of the lines $8020_1$ to $8020_4$ is selected, the respective one of the lines, corresponding to the same voltage band or level $8022_1$ to $8022_4$ is selected.

It will be understood by one skilled in the art that the block 8006 includes four pulse width modulators corresponding to the pulse width modulator 4036 of FIG. 3. Each receive the input signal on line 8016 at its input, and generates its respective output on lines $8020_1$ to $8020_4$. The output on lines $8020_1$ to $8020_4$ are set to either low or high. Similarly for the block 8004, there are provided a corresponding number of pulse width modulators 4036 of FIG. 3.

The output on lines $8020_1$ to $8020_4$ will be high if the input signal is greater than the upper voltage level for that pulse width modulator, and low if the input signal is less than the upper voltage signal for that pulse width modulator. However in order to control the operation of the circuitry, only one output signal may be set at any one time in order to generate a voltage signal. Specifically the highest voltage signal which does not exceed the input voltage must be selected.

Figure 8:
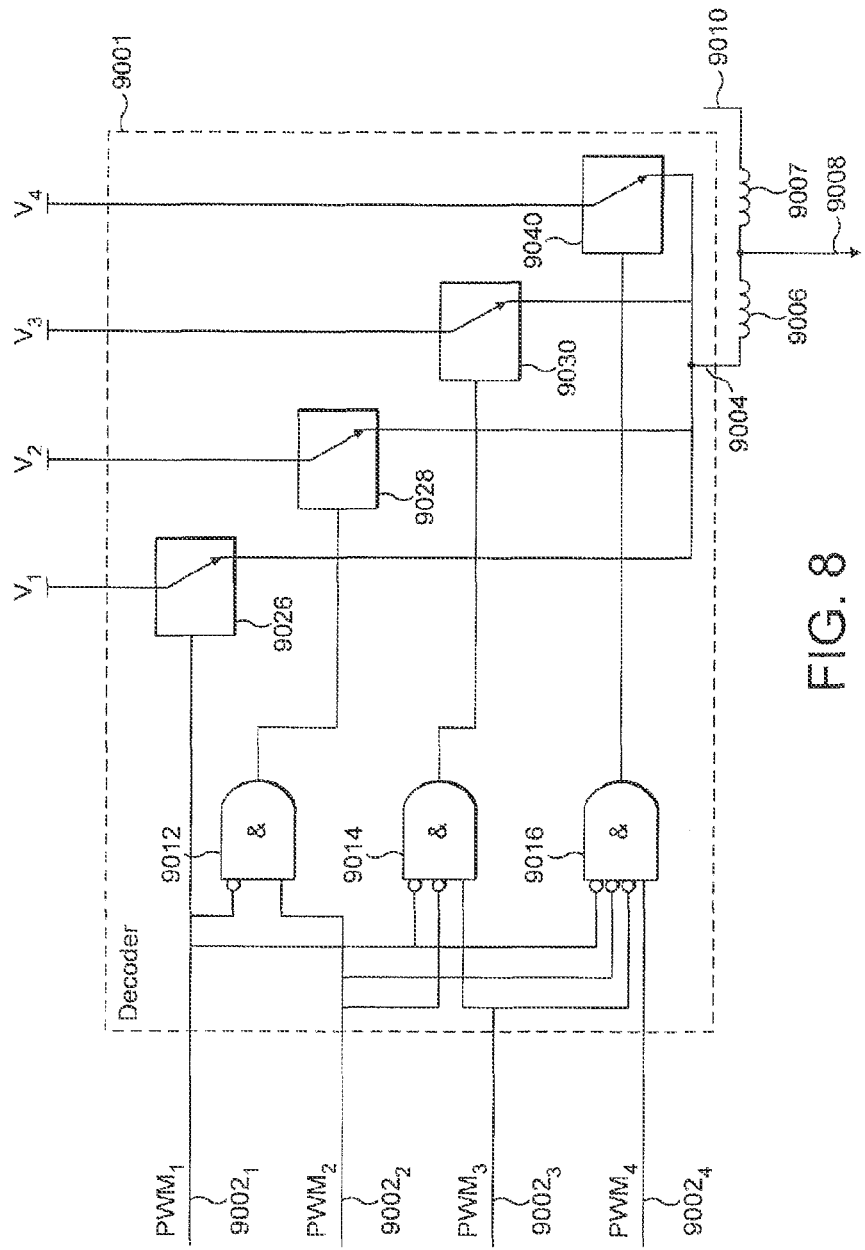
FIG. 8 illustrates schematically an implementation of an embodiment of the invention.

For this purpose the decoder blocks 8016 and 8018 are provided, an exemplary implementation of which is illustrated in FIG. 8.

A decoder block 9001 corresponds to each of the decoder blocks 8016 and 8018 of FIG. 7, i.e. each of the decoder blocks 8016 and 8018 may be implemented in accordance with the decoder block 9001. The decoder block 9001 receives four input signals $9002_1$ to $9002_4$. In the general case the decoder block may receive N inputs. Thus the input signals on lines $9002_1$ to line $9002_4$ correspond to either the input signals $8020_1$ to $8020_4$ or $8022_1$ to $8022_4$ of FIG. 7.

The decoder 9001 of FIG. 8 includes three AND gates 9012, 9014 and 9016. In addition four switches 9026, 9028, 9030 and 9040 are provided.

Each of the switches 9026 to 9040 receives at a first switch terminal thereof a respective one of the four output voltage levels, being denoted by $V_1$ to $V_4$ in the example of FIG. 8. The other switch output terminal of the switches 9026 to 9040 are connected to a common point which connects to an output line 9004. A control signal for each of the switches 9026 to 9040 is also provided as discussed below.

The AND gate 9012 receives at an input the input signal on line $9002_2$, and as a further input the inverse of the input signal on line $9002_1$. The AND gate 9014 receives as an input the input signal on line $9002_3$, and as further inputs the inverse of the input signals on lines $9002_1$ and $9002_2$. The AND gate 9016 receives as an input the input signal on line $9002_4$, and as further inputs the inverse of the input signals on lines $9002_1$, $9002_2$, and $9002_3$.

The control inputs to the switches 9026, 9028, and 9030 and 9040 are, respectively: the input signal on line $9002_1$; the output of the AND gate 9012; the output of the AND gate 9014; and the output of the AND gate 9016.

The output signal on line 9004 is an intermediate output signal, which is connected to an inductor 9006. A further inductor 9007 receives a further intermediate output signal on 9010 which will be provided by the pulse width modulator operating in accordance with the other phase (from block 8004 of FIG. 7 for example) in this dual phase example. The inductors 9006 and 9007 sum the signals to provide the actual output signal on line 9008.

In summary, the decoder 9001 of FIG. 8 operates to decode the outputs from the multi-level pulse width modulators via AND-gating the lower states with the states higher up. Each AND gate is responsive to the ramp switching output, unless a high level is asserted from any ramp switching level higher up, in which case the output becomes low and the respective switch 9026 to 9040 becomes disengaged. In the arrangement of FIG. 8, only one of the switches 9026 to 9040 is closed at any instant, and thus only one of the voltage levels $V_1$ to $V_4$ is provided on the intermediate output line 9004.

Thus with reference to FIGS. 7 and 8 there is illustrated an exemplary arrangement in which the pulse width modulator is implemented for a dual-phase, four-level arrangement, to improve tracking accuracy of an input signal. It will be understood by one skilled in the art that the specific implementations given, particularly in relation to FIG. 8, are exemplary implementations, and other implementations may be provided to achieve the results of the invention.

Figure 9:
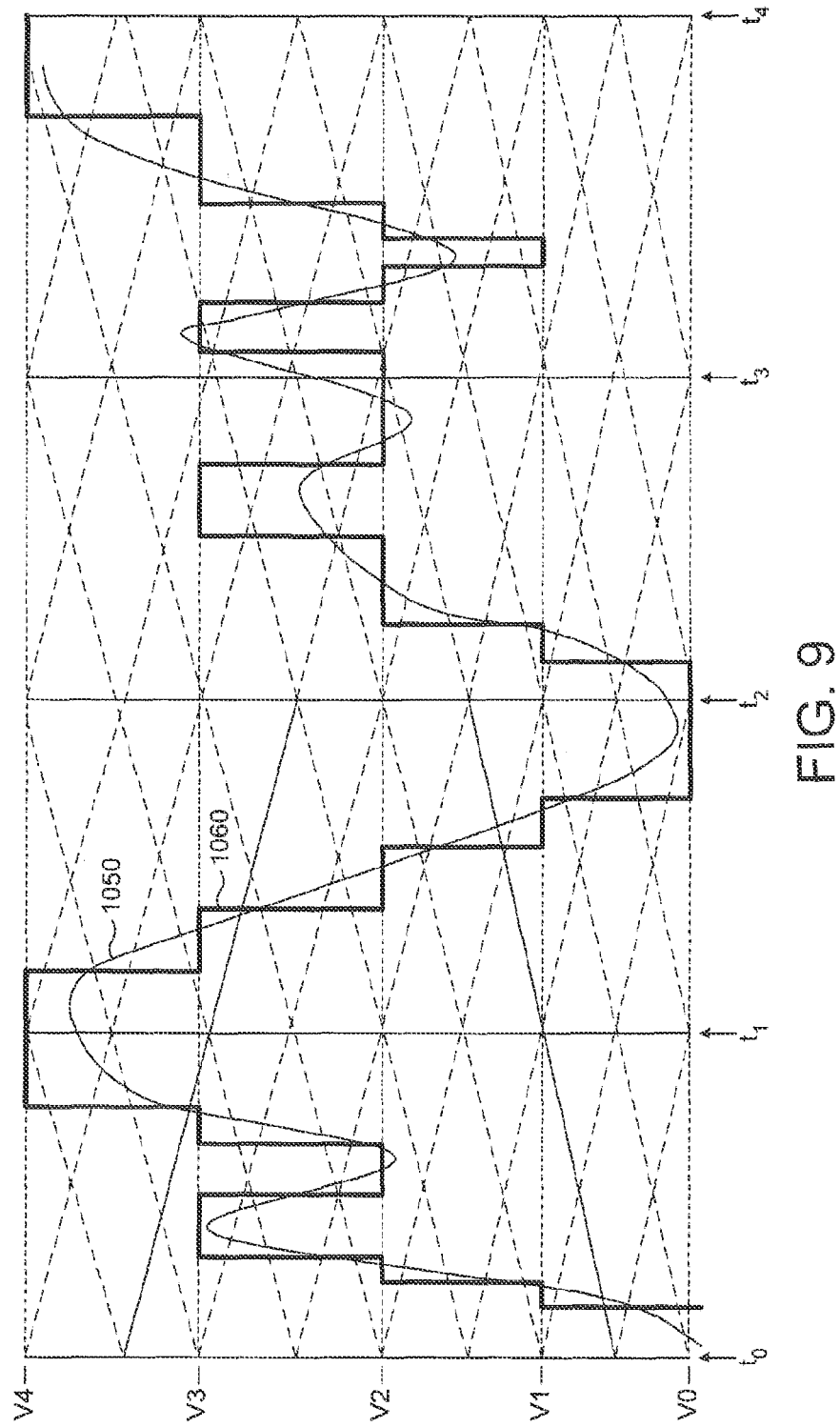
FIG. 9 is a waveform illustrating advantages of an embodiment of the invention.

With reference to FIG. 9 there is illustrated a further modified pulse width modulator operation in accordance with an embodiment of the invention. If multiple output transitions are allowed in one clock cycle, rather than only allowing only a single transition within a given voltage band in any clock cycle, it is possible for the pulse width modulator output to follow very rapidly changing signals. FIG. 9 illustrates a rapidly changing signal denoted by reference numeral 1050, and a corresponding rapidly changing pulse width modulated output signal 1060 for a dual-phase, five-level (four band) arrangement, where more than one transition of the output signal is allowed in a given clock cycle for any given voltage level.

In such an arrangement the number of transitions is determined by the properties of a feedback loop as in a hysteretic converter, rather than being fixed by the clock frequency. However an arrangement in accordance with the invention to achieve the results of FIG. 9 has certain advantages over a hysteretic operation. Specifically, multi-phase operation may be achieved. Further in non-hysteretic mode the switching frequency is fundamentally related to the clock frequency, easing frequency planning issues.

An important requirement for the efficient implementation of embodiments of the invention is that all rising ramps start at voltage level $V_n$ and end at voltage level $V_{(n+1)}$, and that all falling ramps start at voltage level $V_{(n+1)}$ and end at voltage level $V_n$. The start and end of each ramp is the start and end of each cycle.

Figure 10:
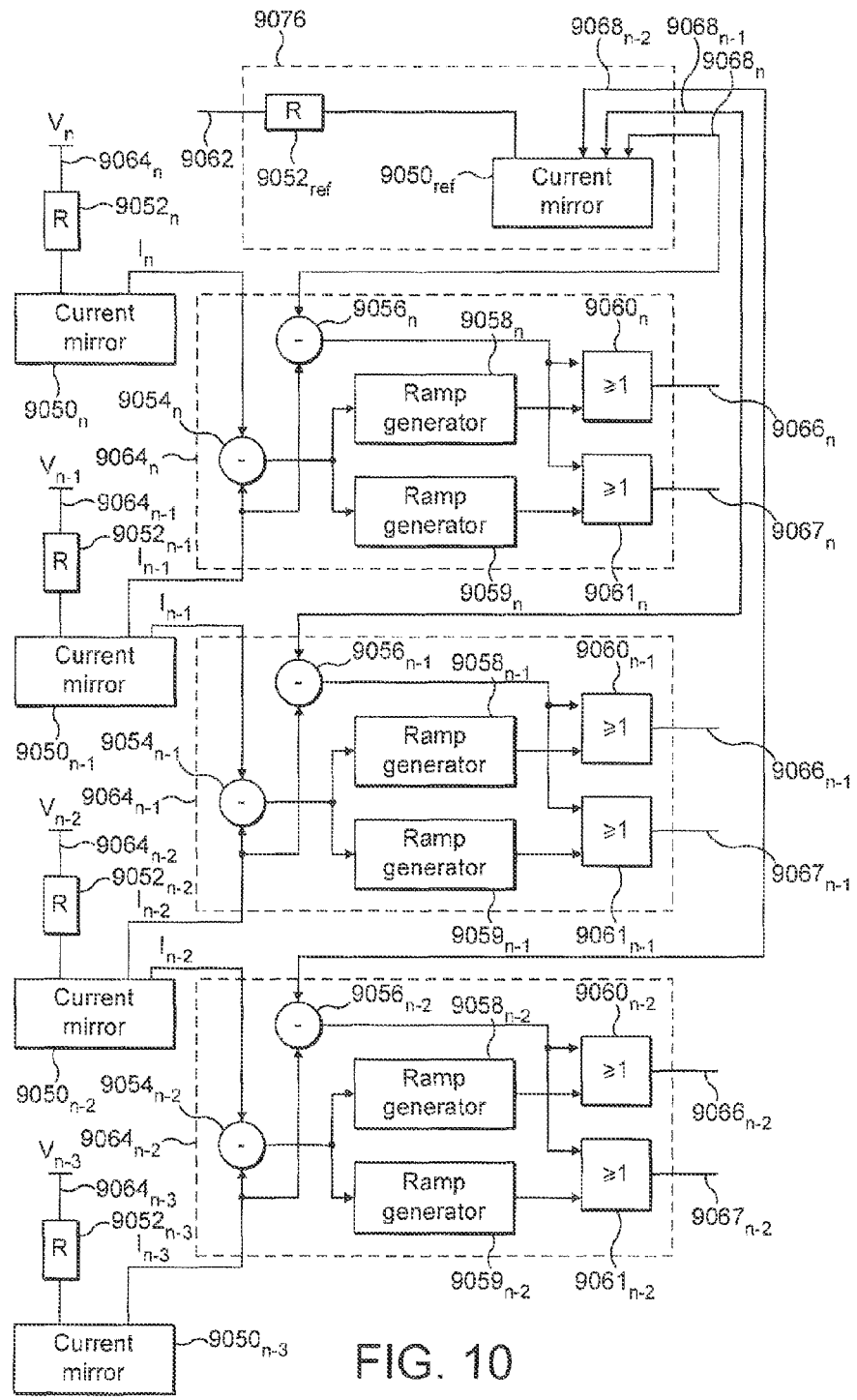
FIG. 10 illustrates an advantageous technique for the generation of rising or falling ramps in a single or multi-level PWM arrangement.

In a multiple level implementation, it is important that the ramps are accurately matched to the supply voltages. With reference to FIG. 10 there is illustrated an advantageous arrangement which guarantees such accuracy.

FIG. 10 illustrates the implementation of circuitry, in an advantageous embodiment, for providing the inputs to comparators such as comparators 4008 and 4010 of FIG. 3, in a multi-level voltage implementation.

A master reference block, denoted by reference numeral 9076, generates a plurality of currents each representing the current associated with the reference signal. As denoted in FIG. 10, the block 9076 receives the reference signal on line 9062. The reference voltage on line 9062 is the reference input signal, for example the input signal on line 4002 of FIG. 3. The reference signal is applied to one terminal of a resistor $9052_{ref}$. The resistor $9052_{ref}$ converts the reference signal voltage to a reference current. The reference current is delivered to a current mirror block $9050_{ref}$. The current mirror block $9050_{ref}$ generates multiple copies of the reference currents, in accordance with the number of voltage levels. The number of copies of the reference current generated is n–1, where n is the number of voltage levels. In the example of FIG. 10, n=4 and the current mirror $9050_{ref}$ generates three copies of the reference current on lines $9068_n$ to $9068_{n-2}$. One of the n–1 copies of the reference current generated by the current mirror block $9050_{ref}$ is used by each of a number n–1 of transition detection stages $9064_n$ to $9064_{n-2}$.

As further illustrated in FIG. 10, each of the voltage levels of the multi-level stage is provided on a respective input line 9064. Thus in the example illustrated $V_n$ is provided on line $9064_n$, $V_{n-1}$ is provided on input line $9064_{n-1}$, $V_{n-2}$ is provided on input line $9064_{n-2}$, and $V_{n-3}$ is provided on line $9064_{n-3}$.

Each of the voltages on the lines 9064 is provided as an input to a respective resistor 9052. The resistor converts the voltage input to a current, which is provided as an input to a respective current mirror 9050. The respective current mirrors 9050 generate one or more copies of this current at one or more outputs thereof.

The current mirrors 9050 associated with the highest and lowest voltages generate one current output. All other current mirrors 9050 generate two outputs.

Thus the input voltage to the multi-level PWM controller, namely the reference voltage, is converted to a reference current by means of a resistor. Similarly each of the voltage levels $V_n$ to $V_{n-3}$ are converted to respective currents $I_n$ to $I_{n-3}$ by means of resistors. All resistors are of equal value R.

Each transition detection stage 9064 includes a first subtractor 9056, a second subtractor 9054, a first ramp generator 9058, a second ramp generator 9059, a first comparator 9060, and a second comparator 9061.

There is a transition detection stage 9064 associated with each voltage band. In the case of an n-level voltage arrangement there are n–1 bands, and hence n–1 transition detection stages 9064.

Thus each of the transition detection stages 9064 is associated with a particular set of upper and lower adjacent voltages, their inputs being currents representative of the upper and lower adjacent voltage signals provided by ones of the current mirrors 9050.

Each transition detection stage 9064 operates in the same way, as is now described.

Each subtractor stage 9054 receives as inputs the current associated with the upper voltage and the current associated with the lower voltage. Thus in general each subtractor stage 9054 receives as its inputs the currents representative of adjacent upper and lower voltage levels.

The result of the subtraction of subtractor 9054, representing the difference between the two input currents, is provided as an input to the ramp generators 9058 and 9059.

One of the ramp generators is a positive-going ramp generator and one is a negative-going ramp generator. Thus ramp generator 9058 may correspond to ramp generator 4004 of FIG. 3, and ramp generator 9059 may correspond to ramp generator 4006 of FIG. 3.

The output of each ramp generator 9058 is provided to one input of the corresponding comparator block 9060, which receives its other input from a subtractor 9056. The output of each ramp generator 9059 is provided to one input of the comparator block 9061, which also receives its other input from a subtractor 9056.

Consistent with the arrangement of FIG. 3, for comparator 9060 the input from the ramp generator is connected to the negative input of the comparator, and the input from the subtractor is connected to the positive input of the comparator. Further for comparator 9061 the input from the ramp generator is connected to the positive input of the comparator, and the input from the subtractor is connected to the negative input of the comparator.

Each subtractor 9056 receives as one input the reference current from the master stage 9076, i.e. the current associated with the reference signal voltage. The second input to the subtractor 9056 is provided by the current associated with the lower voltage signal of the two adjacent voltages. The difference therebetween forms the output of the subtractor 9056.

The subtractor 9056 is described and shown as connected to subtract the current associated with the lower voltage signal of an adjacent voltage level pair from the reference current. In an alternative arrangement, the subtractor 9056 may be arranged to subtract the current associated with the upper voltage signal of an adjacent voltage level pair from the reference current.

Each comparator block 9060 corresponds to the comparator block 4008 of FIG. 3, and each comparator block 9061 corresponds to the comparator block 4010 of FIG. 3.

Thus each comparator block 9061 generates, for each voltage band, an indication as to whether a rising ramp has crossed a falling input signal. As discussed with reference to FIG. 3, the output of the comparator 9061 on line 9067 transitions high in the event, for a given pair of voltage levels or voltage band, the rising ramp crosses a falling input reference signal.

Similarly each comparator block 9060 generates, for each voltage band, an rising input signal. As discussed with reference to FIG. 3, the output of the comparator 9060 on line 9066 transitions high in the event, for a given pair of voltage levels or voltage band, the falling ramp crosses a rising input reference signal.

The subtractor 9054, subtracting the current associated with a lower voltage level from a current associated with an upper voltage level, provides a ramp reference current to the ramp generators 9058 and 9059 that charges a capacitor in the ramp generator block for rising ramps.

For falling ramps the ramp reference current at the output of the subtractor will discharge the capacitor.

Thus each subtractor 9054 is used to control the ramp generated by the ramp generators 9058 and 9059, which form one first inputs to the comparators 9060 and 9061.

As noted above, the current associated with the lower voltage level is also subtracted from the current associated with the reference signal in order to provide the other inputs to the comparators 9060 and 9061.

The provision of the resistors 9052 as equal value resistors means that in addition to tracking the supply voltages, the PWM function is independent of the absolute value of the resistors.

A calibration loop may be used inside the ramp generator blocks 9058 to adjust a capacitance value therein, so that the ramp reaches the reference current at the end of a clock cycle.

The particular benefit of the arrangement of FIG. 10 is that it ensures that a ramp used in PWM signal generation goes between an upper and lower voltage level (or vice versa) accurately. This technique may advantageously applied in a multi-level arrangement, but also works in an arrangement where the voltage can switch between two levels only (i.e. a single level PWM technique). This technique can be used in preferred embodiments of the dual ramp technique described herein, where rising and falling ramps are generated together. However the arrangement is not limited in this way, and advantages of the arrangement are obtained in generating a single ramp, rising or falling, at any one time.

The arrangement does, however, have particular advantages when used in a multi-level arrangement. In such arrangements it is important to ensure that when one ramp finishes at, for example, a voltage level $V_3$, the next ramp starts at the exact voltage level $V_3$ also, and not at a different voltage.

Another requirement is that the ramp should preferably always be present, i.e. the flyback time should be as close to zero as possible. This in effect means that the ramp circuit capacitor be discharged in zero time, which is not technically feasible. Therefore a multiplexed ramp may be implemented, as discussed further hereinbelow with reference to FIGS. 11a and 11b.

Figure 11:
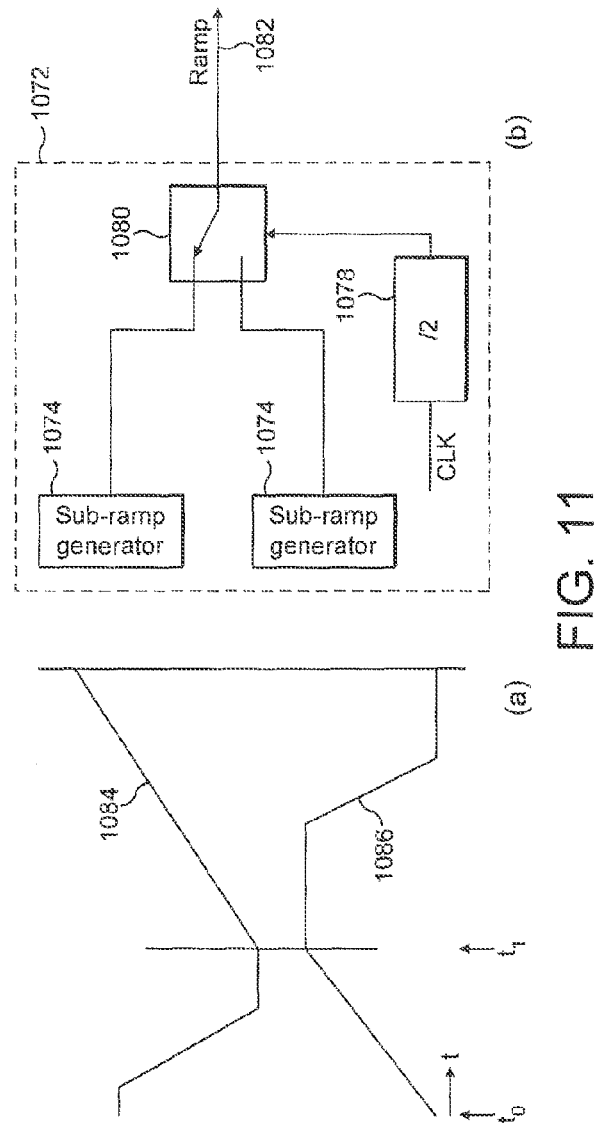
FIGS. 11a and 11b respectively illustrate a waveform and a schematic implementation in an embodiment of the invention.

In accordance with this technique, two ramps 1084 and 1086 operate on alternate cycles. The ramp 1084 of FIG. 11a is generated by a sub-ramp generator 1074 of FIG. 11b, and the ramp 1086 of FIG. 11a is generated by the sub-ramp generator 1076 of FIG. 11b. A multiplexer 1080 receives the ramp generated by each of the generators 1074 and 1076, and connects one to form an output ramp on line 1082. The two ramps generated by the generators 1074 and 1076 operate on alternate cycles under the multiplexer switching.

Switching of the multiplexer 1080 is controlled by a control signal generated by a clock divider 1078, which receives the clock signal CLK at an input.

The ramps charge up during the operating part of the cycle when they are connected through to the output signal line 1082. On the other part of the cycle, when they are disconnected from the output, the ramps are halted and then discharged.

As illustrated in FIG. 11a, at time $t_0$ a ramp is generated by the generator 1076 and the output of this generator is connected to the output on line 1082. As seen in FIG. 11a for the signal 1086, a ramp is generated from the time $t_0$ to $t_1$. At time $t_1$, the clock divider 1078 causes the multiplexer switch 1080 to switch to provide the ramp generator from generator 1074 on line 1082. Thus the signal 1084 appears on the ramp output 1082. As can be seen from FIG. 11a, at time $t_1$ immediately at the end of the ramp provided by the signal 1086 the multiplexer switches to the signal 1084 which commences a ramp rise.

FIGS. 11a and 11b illustrate the generation of successive instantaneous rising ramps. A similar technique may be used to generate falling ramps.

In certain applications, from time to time the output may be required to be reduced from a maximum level. This results in the ramp cells for higher voltage levels not being used. In such cases the ramps can be halted to save power. For example, in a four voltage level arrangement, with voltages V1 to V4, if the input voltage never exceeds V3 the ramps associated with V4 may be halted.

In this description, the expressions 'switch mode' power supply and 'switched mode' power supply are used interchangeably to refer to a power supply which incorporates a switching regulator (and which may also be referred to as a 'switching mode' power supply).

In accordance with the foregoing description there has been presented a number of embodiments for implementing the invention. Various elements of each embodiment may be utilised in isolation or in combination with other described elements. The invention is not limited in its scope to the specifics of any embodiment described herein. The scope of the invention is defined by the appended claims.

What is claimed is:

1. A method of generating a pulse width modulated, PWM, signal representing a time-varying signal, the method comprising, for each time cycle:
   a) generating a rising ramp from a first voltage level to a second voltage level;
   b) generating a falling ramp from the second voltage level to the first voltage level;
   c) detecting a rising slope of the time-varying signal crossing the falling ramp and responsive thereto if the PWM signal is at the first voltage level, transitioning the PWM signal to the second voltage signal; and d) detecting a falling slope of the time-varying signal crossing the rising ramp, and responsive thereto if the PWM signal is at the second voltage level, transitioning the PWM signal to the first voltage signal.

2. The method of claim 1 further comprising, for each time cycle, inhibiting the step of transitioning the PWM signal to the second voltage signal for a second or subsequent detection of a rising slope of the time-varying signal crossing the falling ramp.

3. The method of claim 1 further comprising, for each time cycle, inhibiting the step of transitioning the PWM signal to the first voltage signal for a second or subsequent detection of a falling slope of the time-varying signal crossing the rising ramp.

4. The method of claim 1 comprising generating a multi-phase PWM signal, wherein steps a) to d) are performed for each phase to generate an intermediate PWM signal for each phase, the method further comprising the step of generating the PWM signal representing the time-varying signal by summing the intermediate PWM signals.

5. The method of claim 1 comprising generating a multi-level PWM signal, wherein each level has a respective first voltage level and a second voltage level, wherein steps a) to d) are performed for each level.

6. The method of claim 1 further comprising maintaining the voltage level of the PWM signal on transition between time cycles.

7. The method of claim 1 in which the step of detecting a rising slope of the time-varying signal crossing the falling ramp or detecting a falling slope of the time-varying signal crossing the rising ramp comprises:
  generating a first current representing the first voltage level;
  generating a second current representing the second voltage level;
  subtracting the one current from the other to provide a ramp control signal for controlling the step of generating the rising ramp or the falling ramp;
  generating a reference current representing the time-varying signal;
  subtracting either the first or second current from the reference current to provide a comparison signal; and
  comparing the comparison signal with the generated ramp signal.

8. The method of claim 7 wherein for detecting the rising slope of the time-varying signal crossing the falling ramp the comparator compares the reference current with the inverse of the falling ramp.

9. The method of claim 7 wherein for detecting the falling slope of the time-varying signal crossing the rising ramp the comparator compares the inverse of the reference current with the rising ramp.

10. A Pulse width modulator, PWM, for generating a signal representing a time-varying signal comprising:
  a) a first ramp generator for generating a rising ramp from a first voltage level to a second voltage level;
  b) a second ramp generator for generating a falling ramp from the second voltage to the first voltage level;
  c) a first detector for detecting a rising slope of the time-varying signal crossing the falling ramp and responsive thereto if the PWM signal is at the first voltage level, transition the PWM signal to the second voltage signal; and
  d) a second detector for detecting a falling slope of the time-varying signal crossing the rising ramp, and responsive thereto if the PWM signal is at the second voltage level, transitioning the PWM signal to the first voltage signal.

11. The pulse width modulator of claim 10 in which the means for detecting a rising slope of the time-varying signal crossing the falling ramp or the means for detecting a falling slope of the time-varying signal crossing the rising ramp comprises:
  A first current generator for generating a first current representing the first voltage level;
  A second current generator for generating a second current representing the second voltage level;
  A first subtractor for subtracting the one current from the other to provide a ramp control signal for controlling the means generating the rising ramp or the falling ramp;
  A third current generator for generating a reference current representing the time-varying signal;
  A second subtractor for subtracting either the first or second current from the reference current to provide a comparison signal; and
  A comparator for comparing the comparison signal with the generated ramp signal.

12. The pulse width modulator of claim 11 wherein the means for detecting the rising slope of the time-varying signal crossing the falling ramp is adapted to connect the comparator to compare the reference current with the inverse of the falling ramp.

13. The pulse width modulator of claim 11 wherein the means for detecting the falling slope of the time-varying signal crossing the rising ramp is adapted to connect the comparator to compare the inverse of the reference current with the rising ramp.

14. An envelope tracking modulator for a mobile radio transmission apparatus including a pulse width modulator according to claim 10.

15. A method of generating a pulse width modulated, PWM, signal representing a time-varying signal, the method including the steps of:
  generating a first current in dependence on a first voltage level;
  generating a second current in dependence on a second voltage level
  subtracting one current from the other to provide a ramp control signal;
  generating a ramp between the first and second voltage levels in dependence on the ramp control signal;
  generating a reference current in dependence on the time-varying signal;
  subtracting either the first or second current from the reference current to provide a comparison signal; and
  comparing the comparison signal with the generated ramp signal to detect the transition of the time-varying signal and the ramp in opposite directions.

16. The method of claim 15, further including the step of transitioning the PWM signal to the first or second voltage level in response to detection of the transition of the time-varying signal and the ramp in opposite directions, and if the PWM signal is at the second or first voltage level respectively.

17. The method of claim 15, wherein the first voltage level is a lower voltage level and the second voltage level is an upper voltage level, the ramp being a rising ramp generated from the lower voltage level to the upper voltage level, the method further including, responsive to detection of a transition of a falling slope of the time-varying signal with the rising ramp and in dependence on the PWM signal being at the upper level, transitioning the PWM signal from the upper level to the lower level.

18. The method of claim 15, wherein the first voltage level is an upper voltage level and the second voltage level is a lower voltage level, the ramp being a falling ramp generated from the upper voltage level to the lower voltage level, the method further including, responsive to detection of a transition of a rising slope of the time-varying signal with the falling ramp and in dependence on the PWM signal being at the lower level, transitioning the PWM signal from the lower level to the upper level.

19. The method according to claim 15, wherein:
the step of generating a ramp comprises:
generating a rising ramp between the first and second voltage levels in dependence on the ramp control signal; and
generating a falling ramp between the first and second voltage levels in dependence on the ramp control signal,
and further wherein the step of comparing comprises:
comparing the comparison signal with the generated rising ramp to detect a transition of a falling edge of the time-varying signal with the rising ramp; and
comparing the comparison signal with the generated falling ramp to detect a transition of a rising edge of the time-varying signal with the falling ramp.

20. The method of claim 19 wherein responsive to detection, in said comparing step, a transition of a falling edge of the time-varying signal with the rising ramp, and in dependence on the PWM signal being at the second voltage level, the PWM signal is transitioned to the first voltage level.

21. The method of claim 19 or claim 20 wherein responsive to detection, in said comparing step, a transition of a rising edge of the time-varying signal with the falling ramp, and in dependence on the PWM signal being at the first voltage level, the PWM signal is transitioned to the second voltage level.

22. The method of claim 15 in which the step of generating a ramp between first and second voltage levels takes place in a time cycle.

23. The method of claim 15 wherein said steps are repeated in successive time cycles, the method further comprising carrying forward the PWM state at the end of one time cycle to the beginning of a following time cycle.

24. A pulse width modulator of including:
A first current generator for generating a first current in dependence on a first voltage level;
A second current generator for generating a second current in dependence on a second voltage level;
A first subtractor for subtracting one current from the other to provide a ramp control signal;
A ramp generator for generating a ramp between the first and second voltage levels in dependence on the ramp control signal;
A third current generator for generating a reference current in dependence on the time-varying signal;
A second subtractor for subtracting either the first or second current from the reference current to provide a comparison signal; and
A comparator for comparing the comparison signal with the generated ramp signal to detect the transition of the time-varying signal and the ramp in opposite directions.

25. The pulse width modulator of claim 24 wherein:
The ramp generator comprises:
a first ramp generator for generating a rising ramp between the first voltage and second voltage levels in dependence on the ramp control signal; and
a second ramp generator for generating a falling ramp between the first and second voltage levels in dependence on the ramp control signal,
and further wherein the comparator comprises:
a first comparator for comparing the comparison signal with the generated rising ramp to detect a transition of a falling edge of the time-varying signal with the rising ramp; and
a second comparator for comparing the comparison signal with the generated falling ramp to detect a transition of a rising edge of the time-varying signal with the falling ramp.

26. The pulse width modulator of claim 25 further adapted to, responsive to detection, in a comparator, of a transition of a falling edge of the time-varying signal with the rising ramp, and in dependence on the PWM signal being at the second voltage level, transition the PWM signal to the first voltage level.

27. The pulse width modulator of claim 25 further adapted to, responsive to detection, in a comparator, of a transition of a rising edge of the time-varying signal with the falling ramp, and in dependence on the PWM signal being at the first voltage level, transition the PWM signal to the second voltage level.

28. The pulse width modulator of claim 24 further adapted to carry forward the PWM state at the end of one time cycle to the beginning of a following time cycle.

29. An envelope tracking modulator for a mobile radio transmission apparatus including a pulse width modulator according to claim 24.

* * * * *